US009261569B2

(12) United States Patent
Ariyama et al.

(10) Patent No.: US 9,261,569 B2
(45) Date of Patent: *Feb. 16, 2016

(54) SENSOR DEVICE

(71) Applicant: Seiko Instruments Inc., Chiba-shi, Chiba (JP)

(72) Inventors: Minoru Ariyama, Chiba (JP); Daisuke Muraoka, Chiba (JP); Tomoki Hikichi, Chiba (JP); Kentaro Fukai, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/521,040

(22) Filed: Oct. 22, 2014

(65) Prior Publication Data
US 2015/0040687 A1    Feb. 12, 2015

Related U.S. Application Data

(63) Continuation of application No. PCT/JP2013/060883, filed on Apr. 11, 2013.

(30) Foreign Application Priority Data

Apr. 27, 2012  (JP) ................................. 2012-103219
Feb. 13, 2013  (JP) ................................. 2013-025969

(51) Int. Cl.
*G01R 17/02* (2006.01)
*G01R 33/00* (2006.01)
*G01R 33/07* (2006.01)
*G01L 1/00* (2006.01)
*G01R 33/02* (2006.01)

(52) U.S. Cl.
CPC .............. *G01R 33/0023* (2013.01); *G01L 1/00* (2013.01); *G01R 33/0029* (2013.01); *G01R 33/02* (2013.01); *G01R 33/07* (2013.01)

(58) Field of Classification Search
None
See application file for complete search history.

(56) References Cited

U.S. PATENT DOCUMENTS

| | | | | |
|---|---|---|---|---|
| 8,193,807 | B2 * | 6/2012 | Muraoka et al. | ............... 324/251 |
| 8,866,474 | B2 * | 10/2014 | Muraoka et al. | ............... 324/244 |
| 9,128,127 | B2 * | 9/2015 | Ariyama | ................ G01R 33/07 327/76 |
| 2015/0022241 | A1 * | 1/2015 | Ariyama et al. | ................ 327/76 |

FOREIGN PATENT DOCUMENTS

JP    2010-281801 A    12/2010

* cited by examiner

*Primary Examiner* — Long Nguyen
(74) *Attorney, Agent, or Firm* — Brinks Gilson & Lione

(57) ABSTRACT

Provided is a sensor device capable of removing the influence of each offset voltage of a sensor element, a differential amplifier, and an amplifier of the sensor device, to thereby detect a physical quantity with high precision and respond to high-speed operation. The sensor device includes: a switch circuit connected to a first terminal pair and a second terminal pair of the sensor element, for controlling switching of the terminal pairs and outputting signal voltages; a differential amplifier including a first input terminal and a second input terminal connected to a first output terminal and a second output terminal of the switch circuit, respectively, for outputting a result obtained by amplifying a difference of the signal voltages; an amplifier including at least two differential input pairs, one of which inputs the differential signal output from the differential amplifier, and at least one of which inputs a reference signal corresponding to a physical quantity to be detected; and a detection voltage setting circuit for outputting the reference signal to the amplifier. Switching of the switch circuit provides a first detection state and a second detection state, and detection is performed in one first detection state and one second detection state.

8 Claims, 18 Drawing Sheets

SENSOR DEVICE

RELATED APPLICATIONS

This application is a continuation of PCT/JP2013/060883 filed on Apr. 11, 2013, which claims priority to Japanese Application Nos. 2012-103219 filed on Apr. 27, 2012 and 2013-025969 filed on Feb. 13, 2013. The entire contents of these applications are incorporated herein by reference.

BACKGROUND OF THE INVENTION

1. Field of the Invention

The present invention relates to a sensor device for detecting a physical quantity and converting the detected physical quantity such as magnetic field intensity into an electric signal.

2. Description of the Related Art

A magnetic sensor device is used as a sensor for detecting an open/close state in a flip mobile phone, a notebook computer, or the like and as a sensor for detecting a rotary position of a motor or the like (see, for example, Japanese Patent Application Laid-open No. 2010-281801).

FIG. 18 illustrates a circuit diagram of a conventional magnetic sensor device. In the conventional magnetic sensor device, a magnetoelectric conversion element (such as Hall element) outputs a voltage corresponding to (typically, substantially proportional to) magnetic field intensity (or magnetic flux density), the output voltage is amplified by an amplifier, and a comparator is used to determine whether the amplified output voltage is larger or smaller than a predetermined magnetic field intensity or magnetic flux density (the result is output as a binary value, H signal or L signal).

In general, the output voltage of the magnetoelectric conversion element is minute, and hence an error may occur due to an offset voltage of the magnetoelectric conversion element (element offset voltage), an offset voltage of the amplifier or the comparator (input offset voltage), and noise of those components, and the accuracy may be lower. For example, the element offset voltage is generated by stress on the magnetoelectric conversion element received from a package. For example, the input offset voltage is generated by characteristic fluctuations in elements of an input circuit of the amplifier or the comparator. The noise is generated mainly by flicker noise of a single transistor of the circuit or thermal noise of a single transistor or a resistive element.

The magnetic sensor device illustrated in FIG. 18 is configured as follows in order to reduce the influence of the offset voltages of the magnetoelectric conversion element, the amplifier, and the comparator. The magnetic sensor device includes a Hall element 1801, a switch circuit 1802 for switching the Hall element 1801 between a first detection state and a second detection state, a differential amplifier 1803 for amplifying a voltage difference (V1−V2) of two output terminals of the switch circuit 1802, a comparator 1805, a capacitor 1804 connected between one output terminal of the differential amplifier 1803 and an inverting input terminal of the comparator 1805, a switch 1807 connected between the other output terminal of the differential amplifier 1803 and a non-inverting input terminal of the comparator 1805, a switch 1806 connected between the inverting input terminal and an output terminal of the comparator 1805, a detection voltage setting circuit 1815, and a capacitor 1808 connected between the non-inverting input terminal of the comparator 1805 and an output terminal of the detection voltage setting circuit 1815. The detection voltage setting circuit 1815 includes resistors 1811 to 1814 connected in series between power supply terminals, and switches 1809, 1810x, and 1810z connected between connection points of the respective resistors and the output terminal.

The magnetic sensor device of FIG. 18 operates under control of the switches 1806, 1807, 1809, 1810x, and 1810z in accordance with a timing chart illustrated in FIG. 19. The switches 1810x and 1810z are controlled by a signal 1810 of FIG. 19. When the signal 1810 is ON, one of the switches 1810x and 1810z is turned ON. When the signal 1810 is OFF, the switches 1810x and 1810z are both turned OFF. One period T of the detection operation is divided into a first detection state T1 and a second detection state T2 depending on the operation of the switch circuit 1802 as described above. In the first detection state T1, a power supply voltage is input from terminals A and C of the Hall element 1801, and a signal voltage is output from terminals B and D thereof.

In the second detection state T2, the power supply voltage is input from the terminals B and D, and a signal voltage is output from the terminals A and C. Now, a common-mode signal voltage (hereinafter referred to as "element common-mode voltage") of the Hall element 1801 is represented by Vcm, a differential signal voltage (hereinafter referred to as "element signal voltage") corresponding to the magnetic field intensity of the Hall element 1801 is represented by Vh, an offset voltage (hereinafter referred to as "element offset voltage") of the Hall element 1801 is represented by Voh, the gain of the differential amplifier 1803 is represented by G, input offset voltages of the input terminals V1 and V2 of the differential amplifier 1803 are represented by Voa1 and Voa2, respectively, and an input offset voltage of the comparator 1805 is represented by Voa3.

The element common-mode voltages Vcm in the first detection state T1 and the second detection state T2 are represented by Vcm1 and Vcm2, respectively, the element signal voltages Vh in the first detection state T1 and the second detection state T2 are represented by Vh1 and Vh2, respectively, and the element offset voltages Voh in the first detection state T1 and the second detection state T2 are represented by Voh1 and Voh2, respectively. Voh1 and Voh2 are substantially equal values. The element offset voltages Voh of the Hall element 1801 may be canceled out by a known method, typically called "spinning current". Specifically, the switch circuit 1802 is switched so as to obtain an element offset component that is reverse in phase to a common-mode signal component (or an element offset component that is in-phase to a normal-mode signal component), thereby cancelling out the offset components. One period is further divided into a first phase $\phi1$, a second phase $\phi2$, and a third phase $\phi3$ depending on the open/close states of the respective switches.

In the first phase $\phi1$, the switches 1806 and 1807 are turned ON, and a voltage VC1=V3−V5 is charged in the capacitor 1804. The switch 1806 is turned ON, and hence the comparator 1805 operates as a voltage follower circuit. The Hall element 1801 and the switch circuit 1802 are in the first detection state T1. In the first phase $\phi1$, the respective nodes have the following voltages.

V1=Vcm1+Vh1/2+Voh1/2
V2=Vcm1−Vh1/2−Voh1/2
V3=Vcm1+G·Vh1/2+G·Voh1/2+G·Voa1
V4=Vcm1−G·Vh1/2−G·Voh1/2+G·Voa2
V5=VO=V6+Voa3
V6=V4

The voltage VC1 charged in the capacitor 1804 is expressed as follows.

$$VC1=V3-V5=G \cdot Vh1+G \cdot Voh1+G \cdot Voa1-G \cdot Voa2-Voa3 \quad (a)$$

In the second phase φ2, the switch 1806 is turned OFF, and the Hall element 1801 and the switch circuit 1802 enter the second detection state T2. In the detection voltage setting circuit 1815, the switch 1809 is turned ON while the switches 1810x and 1810z are turned OFF, and a voltage Vr corresponding to one of the voltage-dividing points of the series-connected resistors 1811 to 1814 is supplied to the output terminal as a reference voltage Vref1. Therefore, a voltage Vc2=V6−Vref1=V6−Vr is charged in the capacitor 1808. In the second phase φ2, the respective nodes have the following voltages.

$V1 = Vcm2 - Vh2/2 + Voh2/2$
$V2 = Vcm2 + Vh2/2 - Voh2/2$
$V3 = Vcm2 - G \cdot Vh2/2 + G \cdot Voh2/2 + G \cdot Voa1$
$V4 = Vcm2 + G \cdot Vh2/2 - G \cdot Voh2/2 + G \cdot Voa2$ The voltage VC1 expressed by Expression (a) is held in the capacitor 1804, and hence the node V5 has the following voltage.

$$V5 = V3 - VC1 = Vcm2 - G \cdot Vh2/2 - G \cdot Vh1 - G \cdot Voh1 + G \cdot Voh2/2 + G \cdot Voa2 + Voa3 \quad (b)$$

Based on V6=V4, the voltage VC2 charged in the capacitor 1808 is expressed as follows.

$$VC2 = V6 - Vref1 = V4 - Vr = Vcm2 + G \cdot Vh2/2 - G \cdot Voh2/2 + G \cdot Voa2 - Vr \quad (c)$$

In the third phase φ3, the switch 1807 and the switch 1809 are turned OFF, and the switch 1810x or 1810z is turned ON. In this example, the switch 1810x is turned ON. The reference voltage Vref1 is changed to a voltage Vrx corresponding to one of the voltage-dividing points of the series-connected resistors 1811 to 1814. The voltage VC2 expressed by Expression (c) is held in the capacitor 1808, and hence the node V6 has the following voltage.

$$V6 = Vc2 + Vrx = V6 - Vref1 = V4 - Vr = Vcm2 + G \cdot Vh2/2 - G \cdot Voh2/2 + G \cdot Voa2 - Vr + Vrx \quad (d)$$

Finally, the voltage V5 expressed by Expression (b) and the voltage V6 expressed by Expression (d) are compared to each other in the comparator 1805, and High level or Low level is output from an output terminal VO. Taking the input offset voltage Voa3 of the comparator 1805 into account, the voltages to be compared in the comparator 1805 are expressed as follows.

$$(V6 + Voa3) - V5 = G(Vh1 + Vh2) + G(Voh1 - Voh2) - (Vr - Vrx) \quad (e)$$

In this case, the element offset voltages Voh1 and Voh2 are substantially equal values and therefore canceled out. Expression (e) does not include the input offset voltages Voa1 and Voa2 of the differential amplifier 1803 or the input offset voltage Voa3 of the comparator 1805, thus indicating that those offset voltages are canceled out. Therefore, in the third phase φ3, the comparator 1804 compares the signal component G(Vh1+Vh2) to the reference voltage component (Vr−Vrx) determined by the detection voltage setting circuit 1815. This operation removes the influence of the offset voltage components of the Hall element and the offset voltage components of the differential amplifier and the comparator, which are responsible for an error, thus realizing a magnetic sensor capable of highly-precise output with less fluctuation.

In recent years, however, high-speed operation is required in applications such as motor rotation detection. In the conventional magnetic sensor device described above, one period of the detection operation is made up of three phases, and hence it has been difficult to respond to high-speed operation. Although the conventional magnetic sensor device may be increased in operating speed by shortening the time periods of the respective phases, it is necessary to speed up the operation of the differential amplifier and the comparator. The circuit area becomes larger with an increase in current consumption of the differential amplifier in particular.

SUMMARY OF THE INVENTION

The present invention has been made in view of the above-mentioned circumstances, and it is an object thereof to provide a magnetic sensor device capable of removing the influence of offset voltages of a magnetoelectric conversion element and input offset voltages of an amplifier and a comparator by a simple circuit configuration and detecting magnetic field intensity with high precision at high speed.

In order to solve the conventional problems, a sensor device according to an exemplary embodiment of the present invention has the following configuration.

The sensor device for generating a logic output in accordance with intensity of a physical quantity applied to a sensor element includes: a switch circuit connected to a first terminal pair and a second terminal pair of the sensor element, for controlling switching between a terminal pair supplied with power and a terminal pair for outputting a signal voltage corresponding to the intensity of the physical quantity, and outputting a first signal voltage and a second signal voltage input from the terminal pair of the sensor element; a detection voltage setting circuit for outputting a first reference voltage and a second reference voltage; and a first amplifier including a first input terminal pair, a second input terminal pair, and an output terminal, the first input terminal pair including a first input terminal that is connected to the output terminal via a first switch and inputs a voltage based on the first signal voltage via a first capacitor, the first input terminal pair including a second input terminal that inputs one of a voltage based on the second signal voltage and the second reference voltage, the second input terminal pair including a first input terminal that inputs the first reference voltage, the second input terminal pair including a second input terminal that inputs one of the second reference voltage and the voltage based on the second signal voltage. The switch circuit has a function of switching between: a first detection state in which power is supplied to the first terminal pair of the sensor element and the signal voltage is output from the second terminal pair; and a second detection state in which power is supplied to the second terminal pair of the sensor element and the signal voltage is output from the first terminal pair. The first amplifier is configured to generate the logic output based on one first detection state and one second detection state.

According to the sensor device of the exemplary embodiment of the present invention, the switch, the capacitor, and the amplifier having a plurality of differential input pairs are made use of effectively so that offset components generated in the sensor element, the differential amplifier, and the amplifier of the sensor device may be removed by a simple circuit configuration. Further, a signal processing step is shortened and its operating timings are appropriately set, and hence the detection following a high-speed change in magnetic field may be performed with minimal addition of circuits. Therefore, a sensor device capable of highly-precise and high-speed response may be provided.

DETAILED DESCRIPTION OF THE PREFERRED EMBODIMENTS

A sensor device according to the present invention, such as a magnetic sensor device, is widely used as a sensor for detecting the state of magnetic field intensity, as represented by a sensor for detecting an open/close state in a flip mobile phone, a notebook computer, or the like or a sensor for detecting a rotary position of a motor or the like. Embodiments of the present invention are described below with reference to the accompanying drawings.

First Embodiment

Figure 1:
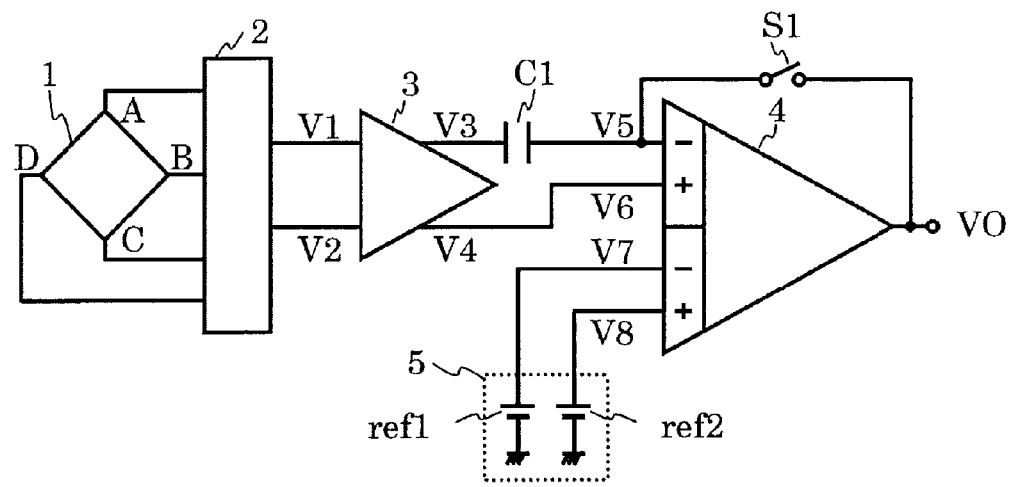
FIG. 1 is a circuit diagram of a magnetic sensor device according to a first embodiment of the present invention.

FIG. 1 is a circuit diagram of a magnetic sensor device according to a first embodiment of the present invention. The magnetic sensor device in the first embodiment includes a Hall element 1 serving as a magnetoelectric conversion element, a switch circuit 2, a differential amplifier 3, an amplifier 4, a capacitor C1, a switch S1, and a detection voltage setting circuit 5. The detection voltage setting circuit 5 includes a reference voltage circuit ref1 and a reference voltage circuit ref2.

The Hall element 1 includes a first terminal pair A-C and a second terminal pair B-D.

The switch circuit 2 includes four input terminals connected to the terminals A, B, C, and D of the Hall element 1, respectively, a first output terminal, and a second output terminal.

The differential amplifier 3 has a first input terminal V1, a second input terminal V2, a first output terminal V3, and a second output terminal V4. The first input terminal V1 and the second input terminal V2 are connected to the first output terminal and the second output terminal of the switch circuit 2, respectively.

The capacitor C1 has two terminals. One terminal is connected to the first output terminal V3 of the differential amplifier 3. The other terminal is connected to a first input terminal V5 of a first differential input pair of the amplifier 4.

The amplifier 4 has four input terminals and one output terminal. Specifically, the amplifier 4 has the first input terminal V5 and a second input terminal V6 of the first differential input pair, a first input terminal V7 and a second input terminal V8 of a second differential input pair, and an output terminal VO. The second input terminal V6 of the first differential input pair of the amplifier 4 is connected to the second output terminal V4 of the differential amplifier 3. The first input terminal V7 of the second differential input pair is connected to a positive terminal of the reference voltage circuit ref1. The second input terminal V8 of the second differential input pair is connected to a positive terminal of the reference voltage circuit ref2.

The switch S1 has two terminals. One terminal is connected to the first input terminal V5 of the first differential input pair of the amplifier 4. The other terminal is connected to the output terminal VO of the amplifier 4. The switch S1 is controlled to be turned ON or OFF in accordance with a switch control signal (not shown in the circuit diagram).

Next, the operation of the magnetic sensor device in the first embodiment is described below.

The switch circuit 2 has a function of switching between a first detection state and a second detection state. In the first detection state, a power supply voltage is input to the first terminal pair A-C of the Hall element 1, and a signal voltage is output from the second terminal pair B-D. In the second detection state, the power supply voltage is input to the second terminal pair B-D, and a signal voltage is output from the first terminal pair A-C.

The Hall element 1 outputs a signal voltage corresponding to magnetic field intensity (or magnetic flux density), and also outputs an offset voltage as an error component.

The differential amplifier 3 has a function of amplifying a difference between two input voltages and outputting the amplified difference as a difference between two output voltages. This amplifier function is represented as follows:

$$V3-V4=G\times(V1-V2) \qquad (1)$$

where G is a gain, and V1 to V4 are voltages at the respective terminals V1 to V4. This function of the differential amplifier 3 is realized by a circuit configuration illustrated in FIG. 2, for example.

Figure 2:
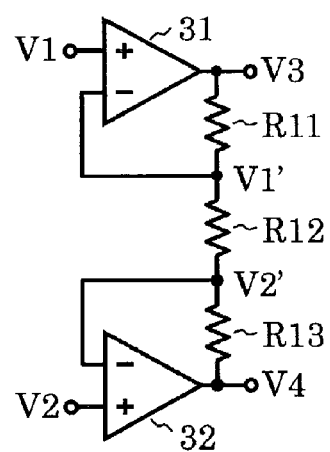
FIG. 2 is an exemplary circuit diagram of a differential amplifier used in the magnetic sensor device of the present invention.

FIG. 2 is a circuit diagram illustrating an example of the differential amplifier 3.

The differential amplifier 3 of FIG. 2 includes differential amplifiers 31 and 32 and resistors R11, R12, and R13. In the differential amplifier 3, the first input terminal V1 is connected to a non-inverting input terminal of the differential amplifier 31, the second input terminal V2 is connected to a non-inverting input terminal of the differential amplifier 32, the first output terminal V3 is connected to an output terminal of the differential amplifier 31, and the second output terminal V4 is connected to an output terminal of the differential amplifier 32. The resistors R11, R12, and R13 are connected in series between the first output terminal V3 and the second output terminal V4. A connection point V1' of the resistors R11 and R12 is connected to an inverting input terminal of the differential amplifier 31. A connection point V2' of the resistors R12 and R13 is connected to an inverting input terminal of the differential amplifier 32.

The differential amplifier 3 has the above-mentioned connections and operates as follows.

The differential amplifier 31 operates as a non-inverting amplifier so that the connection point V1' connected to the inverting input terminal may have a voltage substantially equal to the voltage V1 connected to the non-inverting input terminal. The differential amplifier 32 operates as a non-inverting amplifier so that the connection point V2' connected to the inverting input terminal may have a voltage substantially equal to the voltage V2 connected to the non-inverting input terminal. Equal currents flow through the resistors R11, R12, and R13, and hence the following expressions are obtained.

$$(V3-V1)/R11=(V1-V2)/R12 \qquad (2)$$

$$(V2-V4)/R13=(V1-V2)/R12 \qquad (3)$$

Based on Expression (2) and Expression (3), V3 and V4 are calculated as follows.

$$V3=+(R11/R12+1/2)\times(V1-V2)+(V1+V2)/2 \qquad (4)$$

$$V4=-(R13/R12+1/2)\times(V1-V2)+(V1+V2)/2 \qquad (5)$$

The terms in parentheses including the resistors on the right side of Expression (4) and Expression (5) are represented by "gains G1" and "gain G2", respectively, as follows.

$$G1=R11/R12+1/2 \qquad (6)$$

$$G2=R13/R12+1/2 \qquad (7)$$

Then, Expression (4) and Expression (5) are modified as follows.

$$V3=+G1\times(V1-V2)+(V1+V2)/2 \qquad (8)$$

$$V4=-G2\times(V1-V2)+(V1+V2)/2 \qquad (9)$$

Based on Expression (8) and Expression (9), V3-V4 is calculated as follows.

$$V3-V4(G1+G2)\times(V1-V2) \qquad (10)$$

When the gain G is given as follows, $$G=G1+G2 \qquad (11)$$

Expression (10) is modified as follows, $$V3-V4=G\times(V1-V2) \qquad (12)$$

to be the same result as Expression (1). In other words, the circuit exemplified in FIG. 2 has the function of amplifying a difference between two input voltages and outputting the amplified difference as a difference between two output voltages. Further, the circuit exemplified in FIG. 2 is configured as such an instrument amplifier to suppress an influence of in-phase noise at input. Note that, Expression (13) is obtained based on Expressions (11), (6), and (7).

$$G=(R11+R12+R13)/R12 \qquad (13)$$

Thus, the gain G may be set arbitrarily based on the resistors R11, R12, and R13.

The amplifier 4 has a function of outputting the sum of a value obtained by amplifying the difference of one pair of input voltages and a value obtained by amplifying the difference of another pair of input voltages. This amplifying function is conceptually illustrated in FIG. 3.

Figure 3:
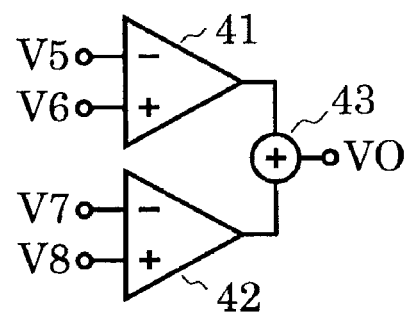
FIG. 3 is an exemplary circuit diagram of an amplifier used in the magnetic sensor device of the present invention.

FIG. 3 is a conceptual diagram illustrating the function of the amplifier 4.

The amplifier 4 of FIG. 3 includes differential amplifiers 41 and 42 and an adder 43, and is connected as follows. In the amplifier 4, the first input terminal V5 of the first differential input pair is connected to an inverting input terminal of the differential amplifier 41, the second input terminal V6 of the first differential input pair is connected to a non-inverting input terminal of the differential amplifier 41, the first input terminal V7 of the second differential input pair is connected to an inverting input terminal of the differential amplifier 42, and the second input terminal V8 of the second differential input pair is connected to a non-inverting input terminal of the differential amplifier 42. An output of the differential amplifier 41 and an output of the differential amplifier 42 are connected to inputs of the adder 43, respectively. An output of the adder 43 is connected to the output terminal VO of the amplifier 4.

The amplifier 4 is connected as described above, and operates as follows.

The differential amplifier 41 amplifies a voltage difference between the two input terminals V5 and V6 and inputs the amplified voltage difference to the adder 43. The differential amplifier 42 amplifies a voltage difference between the two input terminals V7 and V8 and inputs the amplified voltage difference to the adder 43. The adder 43 outputs the sum of the outputs of the differential amplifier 41 and the differential amplifier 42. This amplifying function is expressed by Expression (14).

$$VO=A1\times(V6-V5)+A2\times(V8-V7) \qquad (14)$$

where A1 and A2 represent the gains of the differential amplifiers 41 and 42, and V5 to V8 and VO represent the voltages at the terminals V5 to V8 and VO, respectively.

In the magnetic sensor device of FIG. 1, the first input terminal V5 of the first differential input pair and the output terminal VO of the amplifier 4 illustrated in FIG. 3 are respectively connected to both terminals of the switch S1.

When the switch S1 is turned ON, VO and V5 are substantially equal voltages, and hence VO is expressed as follows based on Expression (14).

$$VO=A1/(1+A1)\times V6+A2/(1+A1)\times(V8-V7) \qquad (15)$$

For the sake of description, the gains A1 and A2 are assumed to be sufficiently large. Then, the following expression is obtained.

$$VO = V6 + (A2/A1) \times (V8 - V7) \quad (16)$$

Specifically, when the switch S1 is turned ON, the output terminal VO of the amplifier 4 is electrically connected to the inverting input terminal of the differential amplifier 41 via the first input terminal V5 of the first differential input pair, to thereby form a feedback loop. Thus, the output voltage VO follows the input voltage V6, and becomes the sum of the input voltage V6 and a voltage obtained by amplifying the voltage difference between the inputs V8 and V7 by the ratio of the gains A2 and A1. In other words, the amplifier 4 operates like a voltage follower.

On the other hand, when the switch S1 is turned OFF, the feedback loop is not formed in the amplifier 4, and hence the amplifier 4 operates as a comparator. Based on Expression (14), Expression (17) is obtained.

$$VO = A1 \times \{(V6 - V5) + (A2/A1) \times (V8 - V7)\} \quad (17)$$

Specifically, when the switch S1 is turned OFF, the amplifier 4 performs a comparison operation of amplifying, by the sufficiently large gain A1, the sum of a difference voltage between V6 and V5 and a voltage obtained by amplifying the difference between V8 and V7 by the ratio of the gains A1 and A2, and outputting a High level signal (typically, positive power supply voltage level) or a Low level signal (typically, negative power supply voltage level or GND level) to the output terminal VO.

Figure 4:
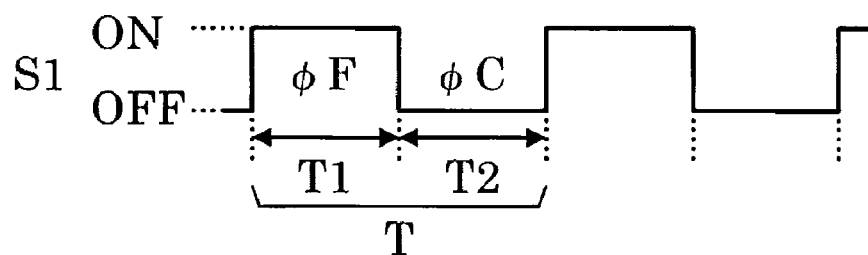
FIG. 4 is an exemplary timing chart of a switch control signal according to the first embodiment of the present invention.

FIG. 4 illustrates a timing chart of a switch control signal.

One period of the detection operation is made up of two phases, a phase $\phi F$ and a phase $\phi C$. The switch S1 is controlled by the switch control signal of FIG. 4 to be turned ON in the phase $\phi F$ and OFF in the phase $\phi C$. The switch circuit 2 and the Hall element 1 are also controlled by the switch control signal to have a first detection state T1 in the phase $\phi F$ and a second detection state T2 in the phase $\phi C$. The outline of the operation of the magnetic sensor device of FIG. 1 in the respective phases is now described. The phase $\phi F$ is a phase in which the element signal voltage and the element offset voltage of the Hall element 1 and the offset voltages of the differential amplifier 3 and the amplifier 4 are stored in the capacitor C1. The phase $\phi C$ is a phase in which a signal voltage corresponding to magnetic field intensity is compared to a detection voltage while cancelling out the offset components generated in the phase $\phi F$. The details are described below.

In the phase $\phi F$, the switch S1 is turned ON. When the switch S1 is turned ON, the amplifier 4 operates like a voltage follower as described above. This is expressed as follows based on Expression (16).

$$V5\phi F = VO\phi F = V6\phi F + (A2/A1) \times (V8\phi F - V7\phi F) \quad (18)$$

"$\phi F$" suffixed to each voltage means the voltage in the phase $\phi F$. In the following, the same notation applies to other voltages and the phase $\phi C$.

A difference $\Delta VC1\phi F$ between the voltage V3 and the voltage V5 is charged in the capacitor C1.

$$\Delta VC1\phi F = V3\phi F - V5\phi F \quad (19)$$

Expression (18) is substituted into the above expression to obtain the following expression.

$$\Delta VC1\phi F = V3\phi F - V6\phi F - (A2/A1) \times (V8\phi F - V7\phi F) \quad (20)$$

In this case, the connection is made so that V6=V4 is established, and the first input terminal V7 of the second differential input pair of the amplifier 4 is connected to the positive terminal of the reference voltage circuit ref1 while the second input terminal V8 of the second differential input pair is connected to the positive terminal of the reference voltage circuit ref2. Thus, when the voltages at the positive terminals of the respective reference voltage circuits are represented by Vref1 and Vref2, Expression (20) is expressed as the following expression.

$$\Delta VC1\phi F = (V3\phi F - V4\phi F) - (A2/A1) \times (Vref2\phi F - Vref1\phi F) \quad (21)$$

Based on Expression (12), Expression (22) is obtained.

$$V3\phi F - V4\phi F = G \times (V1\phi F - V2\phi F) \quad (22)$$

Expression (22) is substituted into Expression (21) to obtain the following expression.

$$\Delta VC1\phi F = G \times (V1\phi F - V2\phi F) - (A2/A1) \times (Vref2\phi F - Vref1\phi F) \quad (23)$$

In other words, a voltage difference between the voltage obtained by amplifying the difference between V1 and V2 by the gain G and the voltage obtained by amplifying the difference between Vref2 and Vref1 by the ratio of the gains A2 and A1 is charged in the capacitor C1.

On the other hand, in the phase $\phi C$, the switch S1 is turned OFF, and the Hall element 1 enters the second detection state T2. The voltage $\Delta VC1\phi F$ is charged in the capacitor C1, and hence the voltage V5 is expressed by the following expression.

$$V5\phi C = V3\phi C - \Delta VC1\phi F \quad (24)$$

The output of the amplifier 4 is expressed by the following expression based on Expression (17).

$$VO\phi C = A1 \times \{(V6\phi C - V5\phi C) + (A2/A1) \times (V8\phi C - V7\phi C)\} \quad (25)$$

As described above, the connection is made so that V6=V4 is established, and the first input terminal V7 of the second differential input pair of the amplifier 4 is connected to the positive terminal of the reference voltage circuit ref1 while the second input terminal V8 of the second differential input pair is connected to the positive terminal of the reference voltage circuit ref2. Thus, Expression (25) is modified as follows.

$$VO\phi C = A1 \times \{(V4\phi C - V5\phi C) + (A2/A1) \times (Vref2\phi C - Vref1\phi C)\} \quad (26)$$

Expression (24) is substituted into this expression to obtain the following expression.

$$VO\phi C = A1 \times \{(V4\phi C - V3\phi C) + (A2/A1) \times (Vref2\phi C - Vref1\phi C)\} + A1 \times \Delta VC1\phi F \quad (27)$$

The voltage $\Delta VC1\phi F$ charged in the capacitor C1, which is expressed by Expression (21), is substituted into the above expression to rearrange Expression (27), thereby obtaining the following expression.

$$VO\phi C = A1 \times [-\{(V3\phi C - V4\phi C) - (V3\phi F - V4\phi F)\} + (A2/A1) \times \{(Vref2\phi C - Vref1\phi C) - (Vref2\phi F - Vref1\phi F)\}] \quad (28)$$

For easy understanding of Expression (28), when a voltage component that is supplied to the amplifier 4 via the differential amplifier 3 is represented by $\Delta Vsig$, and a voltage component that is supplied to the amplifier 4 from the reference voltage setting circuit is represented by $\Delta Vref$, Expression (28) is expressed as follows.

$$VO\phi C = A1 \times [\Delta Vsig + (A2/A1) \times \Delta Vref] \quad (29)$$

In this case, the following expressions are established.

$$\Delta Vsig = -\{(V3\phi C - V4\phi C) - (V3\phi F - V4\phi F)\} \quad (30)$$

$$\Delta Vref = (Vref2\phi C - Vref1\phi C) - (Vref2\phi F - Vref1\phi F) \quad (31)$$

Specifically, the result of comparing the voltage component ΔVsig supplied from the differential amplifier 3 to the voltage obtained by amplifying the voltage component ΔVref supplied from the detection voltage setting circuit 5 by the ratio of the gains A2 and A1 is finally output as a High level signal or a Low level signal from the output terminal VO of the amplifier 4.

Based on Expression (12), Expression (32) is established.

$$V3\phi C-V4\phi C=G\times(V1\phi C-V2\phi C) \quad (32)$$

Thus, Expression (32) and Expression (22) are substituted into Expression (30) to obtain the following expression.

$$\Delta V\text{sig}=-G\times\{(V1\phi C-V2\phi C)-(V1\phi F-V2\phi F)\} \quad (33)$$

Next, a description is given of the operation of the circuit and the transmission of signals and an error component in consideration of the signal voltage and the offset voltage of the Hall element 1 and the offset voltages of the differential amplifier 3 and the amplifier 4.

The element common-mode voltage, the element signal voltage, and the offset voltage of the Hall element 1 are represented by Vcm, Vh, and Voh, respectively, the input offset voltages of the differential amplifier 3 at the first input terminal V1 and the second input terminal V2 are represented by Voa1 and Voa2, respectively, and the input offset voltages of the amplifier 4 at the second input terminal V6 of the first differential input pair and the second input terminal V8 of the second differential input pair are represented by Voa3 and Voa4, respectively.

The following description assumes that the Hall element 1 is in the first detection state T1 in the case of the phase φF and in the second detection state T2 in the case of the phase φC. Regarding the element signal voltage Vh and the offset voltage Voh of the Hall element 1, when the element signal voltage Vh is a normal-mode voltage and the offset voltage Voh is a common-mode voltage between the first detection state T1 and the second detection state T2, the voltages at the terminals V1 and V2 in the respective phases φF and φC are expressed as follows.

$$V1\phi F=Vcm1+Vh1/2+Voh1/2 \quad (34)$$

$$V2\phi F=Vcm1-Vh1/2-Voh1/2 \quad (35)$$

$$V1\phi C=Vcm2-Vh2/2+Voh2/2 \quad (36)$$

$$V2\phi C=Vcm2+Vh2/2-Voh2/2 \quad (37)$$

In this case, "1" or "2" suffixed to the element common-mode voltage Vcm, the element signal voltage Vh, and the offset voltage Voh of the Hall element 1 means a value when the detection states of the Hall element 1 and the switch circuit 2 are the first detection state T1 or the second detection state T2. Based on Expressions (35) to (37), the voltages input to the differential amplifier 3 in the respective phases are expressed as follows.

$$V1\phi F-V2\phi F=+Vh1+Voh1 \quad (38)$$

$$V1\phi C-V2\phi C=-Vh2+Voh2 \quad (39)$$

A differential output V3-V4 of the differential amplifier 3 is expressed as follows by taking the input offset voltages Voa1 and Voa2 into account for V1 and V2 of Expression (12).

$$V3-V4=G\times(V1-V2)+G\times(Voa1-Voa2) \quad (40)$$

Therefore, the output of the differential amplifier 3 includes the difference V1−V2 between the input voltages as well as the voltage obtained by amplifying the difference Voa1−Voa2 between the input offset voltages by the gain G.

Based on Expression (40), the differential output V3-V4 of the differential amplifier 3 in the respective phases is expressed as follows.

$$V3\phi F-V4\phi F=G\times(V1\phi F-V2\phi F)+G\times(Voa1\phi F-Voa2\phi F) \quad (41)$$

$$V3\phi C-V4\phi C=G\times(V1\phi C-V2\phi C)+G\times(Voa1\phi C-Voa2\phi C) \quad (42)$$

Expressions (38) and (39) are substituted into Expressions (41) and (42) to obtain the following expressions.

$$V3\phi F-V4\phi F=G\times(+Vh1+Voh1)+G\times(Voa1\phi F-Voa2\phi F) \quad (43)$$

$$V3\phi C-V4\phi C=G\times(-Vh2+Voh2)+G\times(Voa1\phi C-Voa2\phi C) \quad (44)$$

The voltage at the terminal V5 in the phase φF is expressed as follows based on Expression (18) by taking the input offset voltages of the amplifier 4 into account.

$$V5\phi F=VO\phi F=(V6\phi F+Voa3\phi F)+(A2/A1)\times\{(V8\phi F+Voa4\phi F)-V7\phi F\} \quad (45)$$

Based on Expression (45), the voltage ΔVC1φF to be charged in the capacitor C1 in the phase φF is derived as follows similarly to the above-mentioned derivation based on Expressions (19) to (21).

$$\Delta VC1\phi F=(V3\phi F-V4\phi F-Voa3\phi F)-(A2/A1)\times(V\text{ref}2\phi F+Voa4\phi F-V\text{ref}1\phi F)=(V3\phi F-V4\phi F)-(A2/A1)\times(V\text{ref}2\phi F-V\text{ref}1\phi F)-Voa3\phi F-(A2/A1)\times Voa4\phi F \quad (46)$$

On the other hand, the output VO of the amplifier 4 in the phase φC is expressed as follows based on Expression (25) by taking the input offset voltages of the amplifier 4 into account.

$$VO\phi C=A1\times\{(V6\phi C+Voa3\phi C-V5\phi C)+(A2/A1)\times(V8\phi C+Voa4\phi C-V7\phi C)\} \quad (47)$$

Based on Expression (47), the output VO of the amplifier 4 in the phase φC is derived as follows similarly to the above-mentioned derivation based on Expressions (26) to (28).

$$VO\phi C=A1\times[\{-(V3\phi C-V4\phi C)+(V3\phi F-V4\phi F)\}+(A2/A1)\times\{(V\text{ref}2\phi C-V\text{ref}1\phi C)-(V\text{ref}2\phi F-V\text{ref}1\phi F)\}]+A1\times(Voa3\phi C-Voa3\phi F)+A2\times(Voa4\phi C-Voa4\phi F) \quad (48)$$

The voltage component ΔVsig supplied from the differential amplifier 3, which is expressed by Expression (30), and the voltage component ΔVref supplied from the detection voltage setting circuit 5, which is expressed by Expression (31), are used to modify Expression (48) as follows.

$$VO\phi C=A1\times\{\Delta V\text{sig}+(A2/A1)\times\Delta V\text{ref}\}+A1\times(Voa3\phi C-Voa3\phi F)+A2\times(Voa4\phi C-Voa4\phi F) \quad (49)$$

ΔVsig used in Expression (49) is determined as follows by substituting Expression (43) and Expression (44) into Expression (30).

$$\Delta V\text{sig}=G\times\{(Vh1+Vh2)+(Voh1-Voh2)-(Voa1\phi C-Voa1\phi F)-(Voa2\phi F-Voa2\phi C)\} \quad (50)$$

In this case, strictly, the input offset voltages Voa1 to Voa4 of the differential amplifier 3 and the amplifier 4 have a temporal change or a temperature change (temperature drift) and hence are not constant values. However, if the time periods of the phase φF and the phase φC are sufficiently short with respect to the temporal change or the temperature change of the input offset voltages, the values of the input offset voltages are regarded as values substantially equal between the phase φF and the phase φC. Therefore, in Expression (50) and Expression (49), the values of "Voa1φC−Voa1φF", "Voa2φC−Voa2φF", "Voa3φC−Voa3φF", and "Voa4φC−Voa4φF" are almost zero, and hence the offset components of the differential amplifier 3 and the amplifier 4 are removed in the comparison operation of the amplifier 4 in the phase φC.

In general, the element offset voltage Voh of the Hall element 1 has characteristics of having substantially equal values between the first detection state T1 and the second detection state T2. The value of "Voh1−Voh2" is almost zero, and hence the element offset component is removed in the comparison operation of the amplifier 4 in the phase φC. When the removal components are eliminated from Expression (49) and Expression (50), the following expression is obtained.

$$VO\phi C = A1 \times \{\Delta Vsig + (A2/A1) \times \Delta Vref\} \tag{51}$$

$$\Delta Vsig = G \times (Vh1 + Vh2) \tag{52}$$

ΔVref in Expression (51) is expressed by Expression (31). Therefore, the result of comparing the voltage component ΔVsig obtained by amplifying the sum of the element signal voltages Vh of the Hall element 1 in the first detection state T1 and the second detection state T2 by the gain G of the differential amplifier 3 to the voltage obtained by amplifying the voltage component ΔVref supplied from the detection voltage setting circuit 5 by the ratio of the gains A2 and A1 is finally output as a High level signal or a Low level signal from the output terminal VO of the amplifier 4.

In conclusion, as expressed by Expressions (49) and (50), the magnetic sensor device of the present invention may compare the signal component of the Hall element to the reference voltage while removing all offset components generated in the Hall element 1, the differential amplifier 3, and the amplifier 4, and hence highly-precise magnetic field intensity detection is realized. In an ideal Hall element, the element common-mode voltages Vcm1 and Vcm2 in the first detection state T1 and the second detection state T2 are equal to each other. In an actual Hall element, however, the element common-mode voltages Vcm1 and Vcm2 are not always equal to each other, which is also responsible for an error in highly-precise magnetic field intensity detection. In the magnetic sensor device of the present invention, as expressed by Expressions (51), (52), and (31), the terms of Vcm1 and Vcm2 are not included in the expression indicating the comparison result, and hence highly-precise magnetic field intensity detection without a non-ideal component of the common-mode voltage of the Hall element is realized. In addition, the magnetic sensor device of the present invention may perform magnetic field intensity detection with the two phases, the phase φF and the phase φC, and hence high-speed and highly-precise magnetic field intensity detection is realized.

As expressed by Expression (31), the reference voltage component ΔVref to be compared to the signal component of the Hall element may be arbitrarily set by the values of the reference voltage circuit ref1 and the reference voltage circuit ref2 in the phase φF and the phase φC. In other words, in the magnetic sensor device of the present invention, the reference voltage may be arbitrarily set, and hence the magnetic field intensity to be detected may be arbitrarily set.

In general, the sensitivity of the Hall element depends on temperature, and hence the signal voltage corresponding to magnetic field intensity output from the Hall element 1 also depends on temperature. In order to correct the dependence, for example, temperature dependence is given to the reference voltage circuit ref1 and the reference voltage circuit ref2, to thereby suppress the temperature dependence of the magnetic field intensity to be detected.

Now, a description is given of an exemplary circuit configuration of the detection voltage setting circuit 5, which is a component of the magnetic sensor device of FIG. 1.

Figure 5:
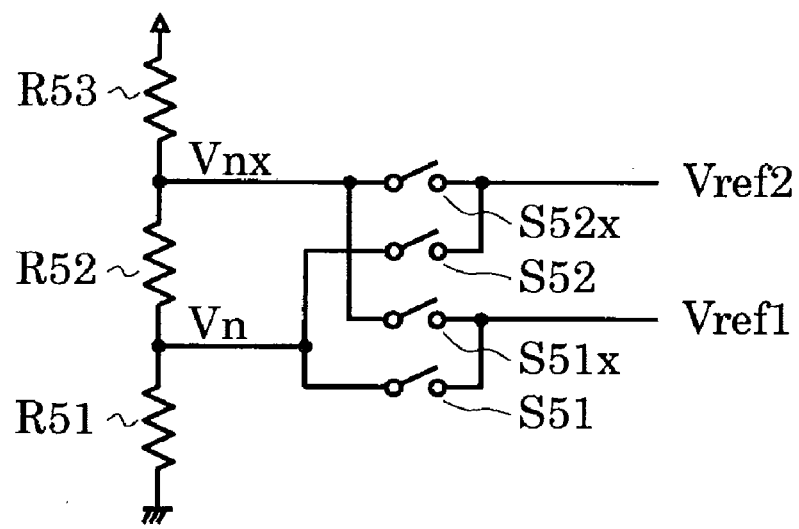
FIG. 5 is an exemplary circuit diagram of a detection voltage setting circuit used in the first embodiment of the present invention.

FIG. 5 is an example of the detection voltage setting circuit 5.

The detection voltage setting circuit 5 of FIG. 5 includes resistors R51, R52, and R53 and switches S51, S51x, S52, and S52x, which are connected as follows. The resistors R53, R52, and R51 are connected in series between a positive power supply voltage terminal (hereinafter referred to as power supply voltage terminal) VDD and a negative power supply voltage terminal (hereinafter referred to as ground terminal) VSS. A connection point of the resistors R51 and R52 is represented by "Vn", and a connection point of the resistor R52 and R53 is represented by "Vnx". The switches S51, S51x, S52, and S52x each have two terminals, and are controlled to be turned ON or OFF in accordance with switch control signals (not shown). One terminal of the switch S51 is connected to the connection point Vn, and the other terminal is connected to a positive terminal of the reference voltage circuit ref1. One terminal of the switch S51x is connected to the connection point Vnx, and the other terminal is connected to the positive terminal of the reference voltage circuit ref1. One terminal of the switch S52 is connected to the connection point Vn, and the other terminal is connected to a positive terminal of the reference voltage circuit ref2. One terminal of the switch S52x is connected to the connection point Vnx, and the other terminal is connected to the positive terminal of the reference voltage circuit ref2. In the following description, voltages at the power supply voltage terminal VDD and the ground terminal VSS are represented by "VDD" and "VSS", respectively; voltages at the connection points Vn and Vnx, "Vn" and "Vnx", respectively; voltages at the positive terminal of the reference voltage circuit ref1 and the positive terminal of the reference voltage circuit ref2, "reference voltage Vref1" and "reference voltage Vref2", respectively.

The detection voltage setting circuit 5 has the above-mentioned connections, and operates as follows.

The voltages at the connection points Vn and Vnx are the following voltages obtained by dividing VDD and VSS by the resistors R53, R52, and R51, respectively.

$$Vn = R51/(R51+R52+R53) \times (VDD-VSS) \tag{53}$$

$$Vnx = (R51+R52)/(R51+R52+R53) \times (VDD-VSS) \tag{54}$$

The voltages Vn and Vnx can be set arbitrarily based on the resistors R51, R52, and R53.

The switches S51 and S51x are controlled so that one switch is turned ON and the other is turned OFF. Therefore, any one of the voltages Vn and Vnx is output as the reference voltage Vref1. Similarly, the switches S52 and 552x are controlled so that one switch is turned ON and the other is turned OFF. Therefore, any one of the voltages Vn and Vnx is output as the reference voltage Vref2.

Figure 6:
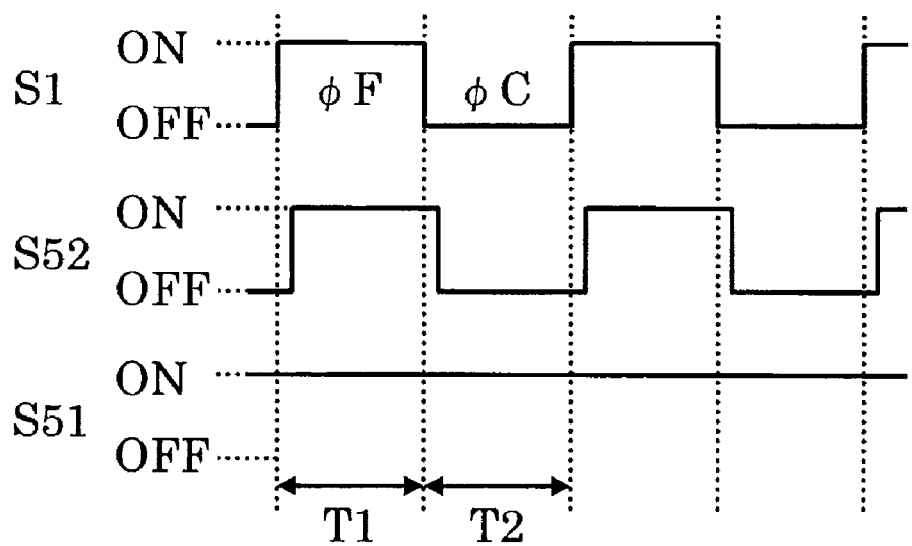
FIG. 6 is an exemplary timing chart of switch control signals according to the first embodiment of the present invention.

Now, it is assumed that the respective switches of the detection voltage setting circuit 5 illustrated in FIG. 5 are controlled by switch control signals of a timing chart illustrated in FIG. 6.

FIG. 6 illustrates the timing chart of the switch control signals.

As described above, the switch S1 is controlled by the switch control signal to be turned ON in the phase φF and OFF in the phase φC. The switches S51 and S51x are controlled by the switch control signals. The switch S51 is turned ON both in the phase φF and in the phase φC, and the switch S51x is turned OFF both in the phase φF and in the phase φC. The switches S52 and S52x are controlled by the switch control signals. The switch S52 is turned ON in the phase φF and OFF in the phase φC. The switch S52x is turned OFF in the phase φF and ON in the phase φC.

In this case, when the switch S1 is turned OFF, in order to prevent an error in a voltage charged in the capacitor C1 in the phase φF, it is necessary to delay the timing of switching the switches S52 and S52x as compared to the timing of turning OFF the switch S1. For clear illustration, the timings are exaggerated in the timing chart of FIG. 6. Note that, in the timing chart of FIG. 6, also when the switch S1 is turned ON, the timing of switching the switches S52 and S52x is delayed. However, when the switch S1 is turned ON, the timing of turning ON the switch S1 and the timing of switching the switches S52 and S52x may be the same. In contrast, the timing of switching the switches S52 and S52x may be earlier.

Through the above-mentioned control of the respective switches, the reference voltages Vref1 and Vref2 in the respective phases are determined as follows.

Vref1φF=Vn
Vref1φC=Vn
Vref2φF=Vn
Vref2φC=Vnx

Based on the expressions above and Expression (31), Expression (55) is obtained.

$$\Delta Vref=(Vnx-Vn) \quad (55)$$

Therefore, ΔVref to be compared to the signal component from the Hall element 1 in the amplifier 4 is given as the difference between the voltages Vn and Vnx that may be arbitrarily set. As described above, according to the magnetic sensor device of the present invention, the reference voltage may be arbitrarily set, in other words, the magnetic field intensity to be detected may be arbitrarily set.

Figure 7:
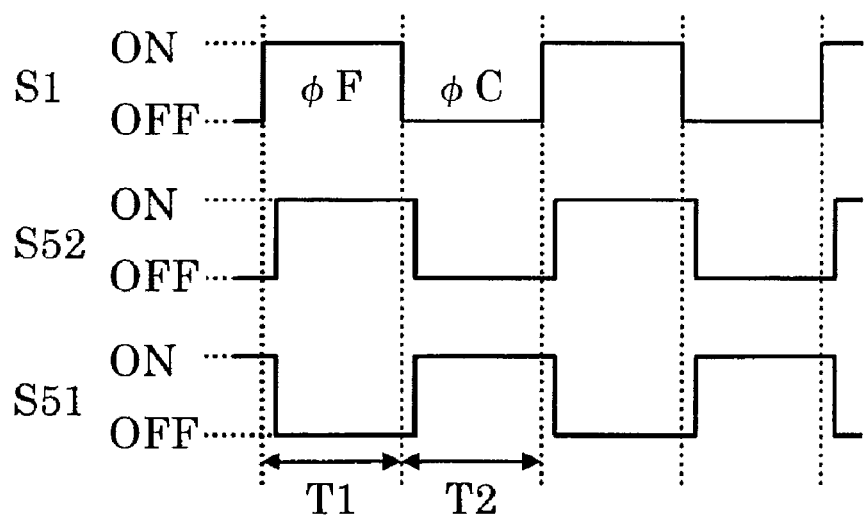
FIG. 7 is another exemplary timing chart of the switch control signals according to the first embodiment of the present invention.

Next, it is assumed that the respective switches of the detection voltage setting circuit 5 illustrated in FIG. 5 are controlled by switch control signals of a timing chart illustrated in FIG. 7.

FIG. 7 illustrates an exemplary timing chart of the switch control signals. The timing chart of FIG. 7 is different from the timing chart of FIG. 6 in that the switch S51 is controlled to be turned OFF in the phase φF and ON in the phase φC and the switch S51x is controlled to be turned ON in the phase φF and OFF in the phase φC. Through the above-mentioned control of the respective switches, the reference voltages Vref1 and Vref2 in the respective phases are determined as follows.

Vref1φF=Vnx
Vref1φC=Vn
Vref2φF=Vn
Vref2φC=Vnx

Based on the above expressions and Expression (31), Expression (56) is obtained.

$$\Delta Vref=2\times(Vnx-Vn) \quad (56)$$

Therefore, the voltage that is twice the voltage ΔVref obtained in the timing chart of FIG. 6 is obtained. Specifically, by switching the control of ON and OFF of the switches S51, S51x, S52, and S52x in the state where the values of the resistors R51, R52, and R53 are uniquely determined and the voltages at the connection points Vn and Vnx are uniquely determined, the magnetic field intensity to be detected may be switched.

Figure 8:
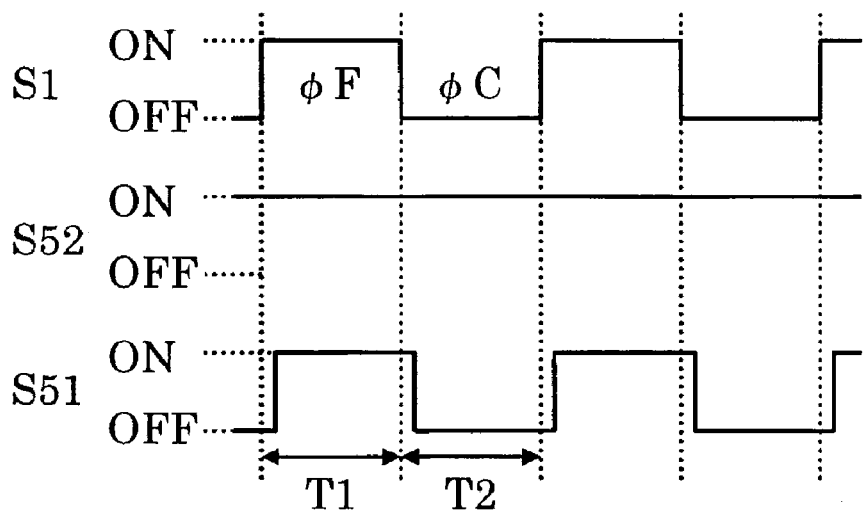
FIG. 8 is another exemplary timing chart of the switch control signals according to the first embodiment of the present invention.

Alternatively, it is assumed that the respective switches of the detection voltage setting circuit 5 illustrated in FIG. 5 are controlled by switch control signals of a timing chart illustrated in FIG. 8.

FIG. 8 illustrates an exemplary timing chart of the switch control signals. The timing chart of FIG. 8 is different from the timing chart of FIG. 6 in that the switch S51 is turned OFF in the phase φC, the switch S51x is turned ON in the phase φC, the switch S52 is turned ON both in the phases φF and φC, and the switch S52x is turned OFF both in the phases φF and φC.

Through the above-mentioned control of the respective switches, the reference voltages Vref1 and Vref2 in the respective phases are determined as follows.

Vref1φF=Vn
Vref1φC=Vnx
Vref2φF=Vn
Vref2φC=Vn

Based on the above expressions and Expression (31), Expression (57) is obtained.

$$\Delta Vref=-(Vnx-Vn) \quad (57)$$

Therefore, the voltage that is reverse in polarity to the voltage ΔVref obtained in the timing chart of FIG. 6 is obtained. In this case, the characteristics of the typical Hall element show that the polarity of the element signal voltage Vh to be output to the output terminal pair of the Hall element 1 is reversed between the S-pole and the N-pole. Specifically, the signal component input to the amplifier 4 is reversed in polarity between the detection of the S-pole and the detection of the N-pole. It is therefore necessary for the detection voltage setting circuit 5 to set detection voltages having reverse polarities. In the case of the timing chart of FIG. 8, ΔVref with the polarity reverse to that in the case of the timing chart of FIG. 6 is obtained, which satisfies the above-mentioned requirement. Specifically, by switching the switches to be turned ON and OFF between the phase φF and the phase φC so as to reverse the polarity of ΔVref, the detection may be performed while discriminating between the S-pole and the N-pole.

Figure 9:
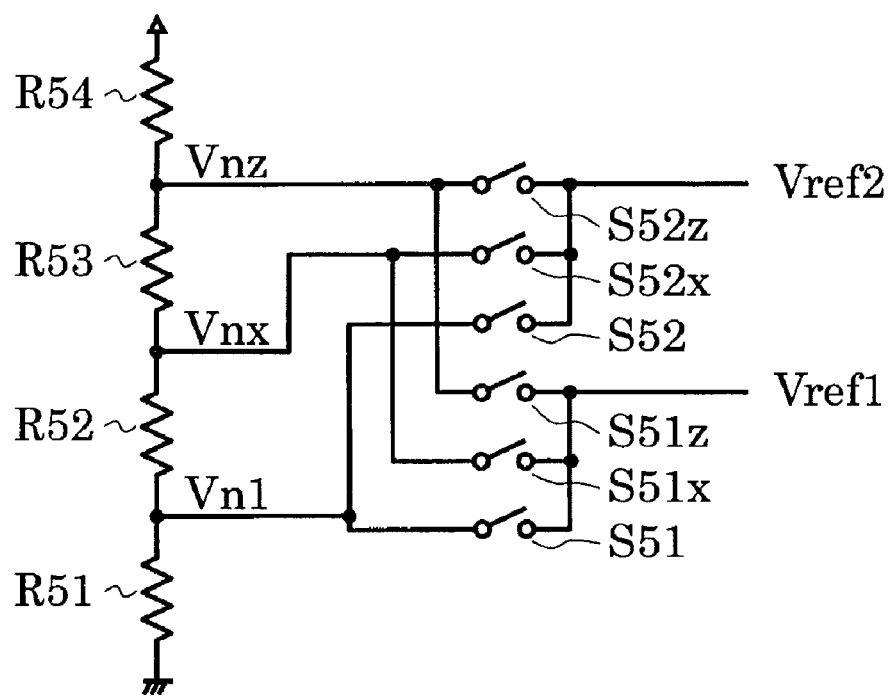
FIG. 9 is another exemplary circuit diagram of the detection voltage setting circuit used in the first embodiment of the present invention.

FIG. 9 illustrates another example of the detection voltage setting circuit 5.

FIG. 9 is an example of the detection voltage setting circuit 5. FIG. 9 is different from FIG. 5 in that a resistor R54 and switches S51z and S52z are added. The added components are configured and connected as follows. The resistor R54 is connected in series between the power supply voltage terminal VDD and the resistor R53 of FIG. 5. A connection point between the resistors R53 and R54 is referred to as "Vnz". Each of the switches S51z and S52z has two terminals, and is controlled to be turned ON or OFF in accordance with a switch control signal (not shown). One terminal of the switch S51z is connected to the connection point Vnz, and the other terminal thereof is connected to the positive terminal of the reference voltage circuit ref1. One terminal of the switch S52z is connected to the connection point Vnz, and the other terminal thereof is connected to the positive terminal of the reference voltage circuit ref2. The other components than the added ones are connected similarly to FIG. 5.

The detection voltage setting circuit 5 is connected as described above, and operates as follows.

The voltages at the connection points Vn, Vnx, and Vnz are the following voltages obtained by dividing VDD and VSS by the resistors R54, R53, R52, and R51.

$$Vn=R51/(R51+R52+R53+R54)\times(VDD-VSS) \quad (58)$$

$$Vnx=(R51+R52)/(R51+R52+R53+R54)\times(VDD-VSS) \quad (59)$$

$$Vnz=(R51+R52+R53)/(R51+R52+R53+R54)\times(VDD-VSS) \quad (60)$$

The voltages Vn, Vnx, and Vnz may be arbitrarily set by the resistors R51, R52, R53, and R54.

The switches S51, S51x, and S51z are controlled so that the switches S51x and S51z are both turned OFF when the switch S51 is turned ON and that one of the switches S51x and S51z is turned ON and the other is turned OFF when the switch S51 is turned OFF. Similarly, the switches S52, S52x, and S52z are controlled so that the switches S52x and S52z are both turned OFF when the switch S52 is turned ON and that one of the switches S52x and S52z is turned ON and the other is turned OFF when the switch S52 is turned OFF. The switches S51z and S52z are provided to provide hysteresis to the detection voltage. In the case where magnetic field intensity is detected by a detection voltage set by the switch S51z or S52z, the switch to be turned ON in the next detection period T is changed from S51z to S51x or from S52z to S52x. Similarly, in the case where magnetic field intensity detection is cancelled, the switch to be turned ON in the next detection period T is changed from S51x to S51z or from S52x to S52z. In this way, chattering generated at the time of magnetic field intensity detection and cancelling may be suppressed.

In conclusion, as described above with reference to FIGS. 5 to 9, the magnetic sensor device according to the present invention may realize arbitrary setting of the magnetic field intensity to be detected by the magnitude and polarity of the voltage component ΔVref supplied from the detection voltage setting circuit 5 to the amplifier 4, easy discrimination between the S-pole and the N-pole, and easy setting of hysteresis between the detection and cancelling. Those various functions of the circuit configuration in this embodiment are achieved by not only the circuit configuration of the detection voltage setting circuit 5 illustrated in FIGS. 5 and 9 but also the circuit configuration in which, as expressed by Expression (31), the reference voltage component ΔVref may be set by the voltages of the reference voltage circuit ref1 and the reference voltage circuit ref2 in the phase φF and the phase φC.

Now, a description is given of an exemplary circuit configuration of the amplifier 4, which is a component of the magnetic sensor device of FIG. 1. The function of the amplifier 4 illustrated in the conceptual diagram of FIG. 3 is more specifically realized by a circuit configuration illustrated in FIG. 10, for example.

Figure 10:
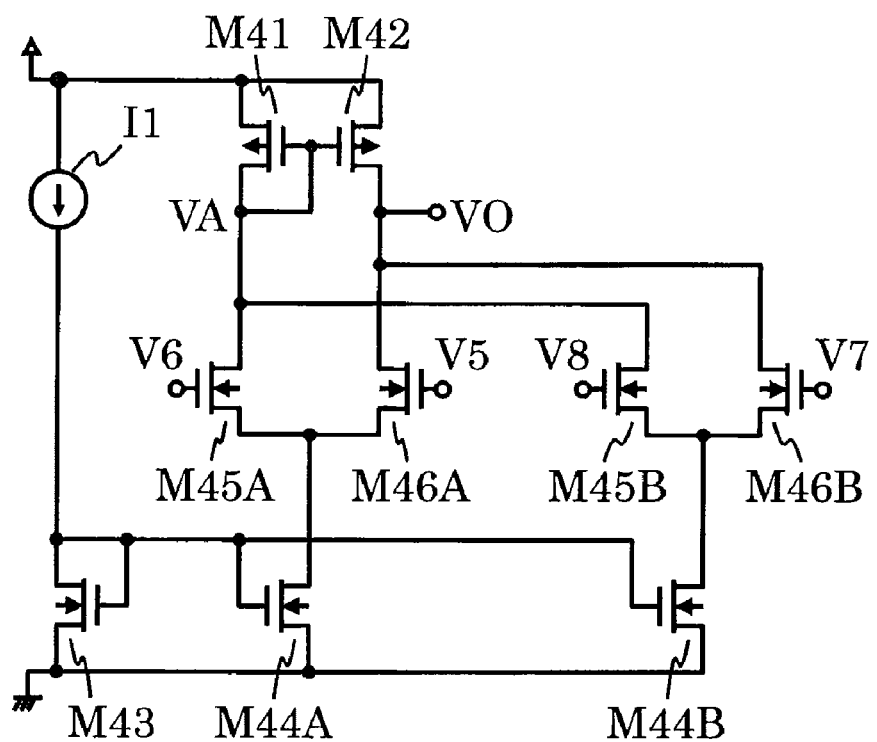
FIG. 10 is another exemplary circuit diagram of the amplifier used in the magnetic sensor device according to the present invention.

FIG. 10 is an exemplary circuit diagram of the amplifier 4.

The amplifier 4 includes a constant current circuit I1, NMOS transistors M43, M44A, M44B, M45A, M46A, M45B, and M46B, and PMOS transistors M41 and M42, which are connected as follows. One terminal of the constant current circuit I1 is connected to the power supply voltage terminal VDD, and the other terminal thereof is connected to a drain and a gate of the NMOS transistor M43. This connection point is referred to as "VBN". The connection point VBN is connected to a gate of the NMOS transistor M44A and a gate of the NMOS transistor M44B. A source of each of the NMOS transistors M43, M44A, and M44B is connected to the ground terminal VSS. A source of each of the NMOS transistors M45A and M46A is connected to a drain of the NMOS transistor M44A. A source of each of the NMOS transistors M45B and M46B is connected to a drain of the NMOS transistor M44B. A drain of each of the NMOS transistors M45A and M45B is connected to a drain of the PMOS transistor M41. This connection point is referred to as "VA". A drain of each of the NMOS transistors M46A and M46B is connected to a drain of the PMOS transistor M42. This connection point is connected to the output terminal VO of the amplifier 4. A gate of each of the PMOS transistors M41 and M42 is connected to the connection point VA, and a source thereof is connected to the power supply voltage terminal VDD. Gates of the NMOS transistors M45A and M46A are connected to the second input terminal V6 and the first input terminal V5 of the first differential input pair, respectively. Gates of the NMOS transistors M45B and M46B are connected to the second input terminal V8 and the first input terminal V7 of the second differential input pair, respectively.

The amplifier 4 is connected as described above, and operates as follows.

The constant current circuit I1 generates a constant current to be supplied to the NMOS transistor M43. The NMOS transistors M43, M44A, and M44B form a current mirror circuit. A current based on a current flowing between the drain and source of the NMOS transistors M43 flows between the drain and source of each of the NMOS transistors M44A and M44B. Five transistors of the NMOS transistors M44A, M45A, and M46A and the PMOS transistors M41 and M42 form a differential amplifier, which operates to amplify a gate voltage difference of the NMOS transistors M45A and M46A constituting the first differential input pair, that is, a voltage difference between the second input terminal V6 of the first differential input pair and the first input terminal V5 of the first differential input pair, and output the amplified voltage difference to the output terminal VO. This gain is referred to as "A1". The operations of the current mirror circuit configuration and the differential amplifier configuration are described in detail in the literature of CMOS analog circuits and the like, and the detailed description is herein omitted. Similarly, five transistors of the NMOS transistors M44B, M45B, and M46B and the PMOS transistors M41 and M42 form a differential amplifier, which operates to amplify a gate voltage difference between the NMOS transistors M45B and M46B constituting the second differential input pair, that is, a voltage difference between the second input terminal V8 of the second differential input pair and the first input terminal V7 of the second differential input pair, and output the amplified voltage difference to the output terminal VO. This gain is referred to as "A2". The drain of the NMOS transistor M45A constituting the first differential input pair and the drain of the NMOS transistor M45B constituting the second differential input pair are connected to the drain of the PMOS transistor M41 at the connection point VA. The drain of the NMOS transistor M46A constituting the first differential input pair and the drain of the NMOS transistor M46B constituting the second differential input pair are connected to the drain of the PMOS transistor M42 at the output terminal VO. The amplifier 4 operates so that the voltages obtained by amplification by the first differential input pair and the second differential input pair are added at the connection point VA and the output terminal VO. This operation is expressed as follows.

$$VO = A1 \times (V6-V5) + A2 \times (V8-V7) \tag{61}$$

In other words, the operation similar to Expression (14) is performed.

Figure 11:
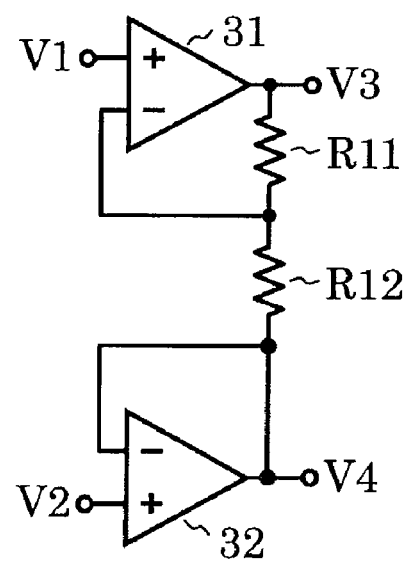
FIG. 11 is another exemplary circuit diagram of the differential amplifier used in the magnetic sensor device according to the present invention.

The operation of the magnetic sensor device according to the first embodiment of the present invention has been described above to show that highly-precise and high-speed magnetic detection may be realized. In the description above, the specific circuit configurations and timing chart for the differential amplifier 3, the amplifier 4, and the detection voltage setting circuit 5 have been exemplified. However, this embodiment is not necessarily limited to this configuration as long as the operation described above may be performed. For example, the specific configuration of the differential amplifier 3 is not limited to FIG. 2. As illustrated in FIG. 11, the resistor R13 may be removed for direct connection. The gain G of the differential amplifier 3 in this case is expressed by Expression (62) which is modified from the gain expression of Expression (13) with a minimum value of the resistor R13.

$$G = (R11+R12)/R12 \tag{62}$$

This does not deviate from the gist of the present invention, that is, realizing highly-precise and high-speed magnetic detection.

The above description shows that the detection may be performed while discriminating between the S-pole and the N-pole, but the magnetic sensor device according to the present invention is also applicable to bipolar detection (such as motor rotation detection). The bipolar detection is performed by a magnetic sensor device in a manner that the state of detecting only one pole (such as S-pole) is switched to the state of detecting only the other pole (N-pole) when the one pole is detected.

In the timing chart of FIG. 4, 6, 7, or 8, the respective switches may be controlled to detect the S-pole in one detection period T and detect the N-pole in another detection period T.

Further, in the timing chart of FIG. 4, 6, 7, or 8, there may be employed a driving method in which a standby period of a given time is provided between one detection period T and another detection period T to suppress average current consumption of the magnetic sensor device. Also in this case, the effect of highly-accurate magnetic detection may be obtained.

In the above description, the first detection state T1 is set in the phase φF and the second detection state T2 is set in the phase φC, but conversely, the first detection state T1 may be set in the phase φC and the second detection state T2 may be set in the phase φF.

Second Embodiment

Figure 12:
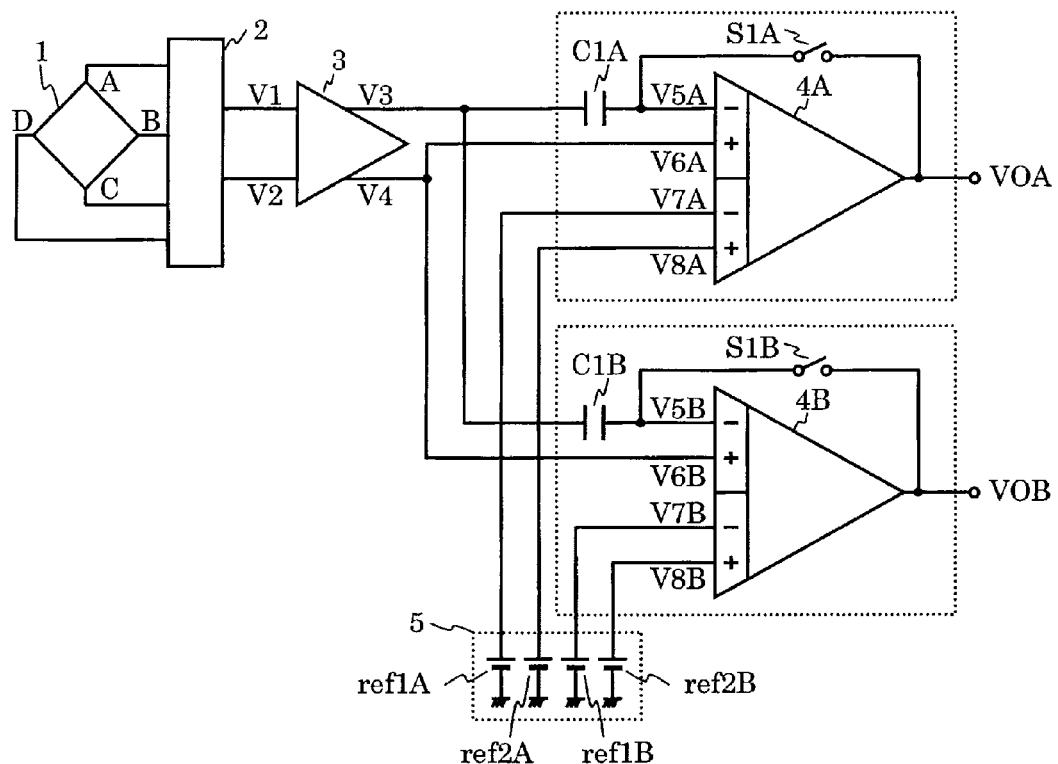
FIG. 12 is a circuit diagram of a magnetic sensor device according to a second embodiment of the present invention.

FIG. 12 is a circuit diagram of a magnetic sensor device according to a second embodiment of the present invention. The second embodiment of FIG. 12 is different from the first embodiment of FIG. 1 in that an amplifier 4B, a capacitor C1B, and a switch S1B are added and symbol A is suffixed to the amplifier 4, the capacitor C1, and the switch S1 for clear discrimination from the added components, and that a reference voltage circuit ref1B and a reference voltage circuit ref2B are added in the detection voltage setting circuit 5 and symbol A is suffixed to the reference voltage circuit ref1 and the reference voltage circuit ref2 for clear discrimination from the added components. Symbols A and B are suffixed also to the terminals for discrimination. The added components are configured and connected as follows.

Similarly to the configuration of the capacitor C1A, the capacitor C1B has two terminals. One terminal is connected to the first output terminal V3 of the differential amplifier 3. The other terminal is connected to a first input terminal V5B of a first differential input pair of the amplifier 4B.

Similarly to the configuration of the amplifier 4A, the amplifier 4B has four input terminals and one output terminal. Specifically, the amplifier 4B has the first input terminal V5B and a second input terminal V6B of the first differential input pair, a first input terminal V7B and a second input terminal V8B of a second differential input pair, and an output terminal VOB. The second input terminal V6B of the first differential input pair of the amplifier 4B is connected to the second output terminal V4 of the differential amplifier 3. The first input terminal V7B of the second differential input pair is connected to a positive terminal of the reference voltage circuit ref1B. The second input terminal V8B of the second differential input pair is connected to a positive terminal of the reference voltage circuit ref2B.

Similarly to the configuration of the switch S1A, the switch S1B has two terminals. One terminal is connected to the first input terminal V5B of the first differential input pair of the amplifier 4B. The other terminal is connected to the output terminal VOB of the amplifier 4B. The switch S1B is controlled to be turned ON or OFF in accordance with a switch control signal (not shown in the circuit diagram). The other connections and configurations are the same as in the first embodiment.

Next, the operation of the magnetic sensor device in the second embodiment is described below. Similarly to the amplifier 4A, the amplifier 4B operates similarly to the above-mentioned amplifier 4. The configuration formed of the capacitor C1B, the amplifier 4B, and the switch S1B is equivalent to the above-mentioned configuration formed of the capacitor C1A, the amplifier 4A, and the switch S1A. The capacitor C1B, the amplifier 4B, and the switch S1B operate similarly as described in the first embodiment.

Figure 13:
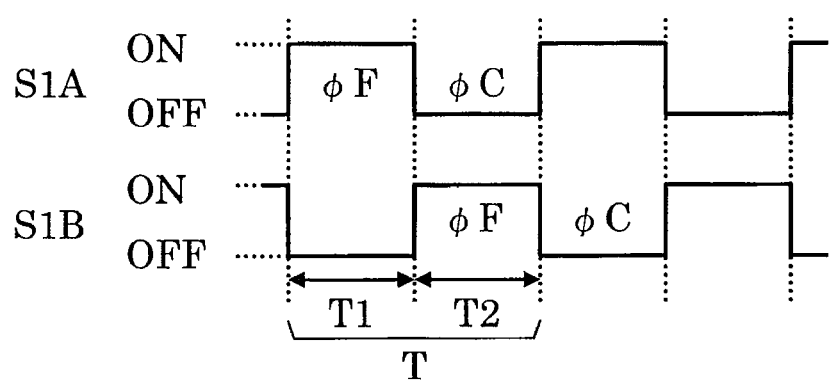
FIG. 13 is an exemplary timing chart of switch control signals according to the second embodiment of the present invention.

FIG. 13 illustrates a timing chart of the switch control signals in the magnetic sensor device according to the second embodiment. The timing chart of the switch control signals of FIG. 13 is different from the timing chart in the first embodiment illustrated in FIG. 4 in that the control signal of the added switch S1B is additionally illustrated, and symbol A is suffixed to the control signal of the switch S1 for clear discrimination from the added component. Similarly to the switch S1A, the switch S1B is controlled to be turned ON in the phase φF and OFF in the phase φC. The switch S1A and the switch S1B are controlled so that the switch S1B is in the phase φC when the switch S1A is in the phase φF and that the switch S1B is in the phase φF when the switch S1A is in the phase φC.

In this case, the circuit configuration A formed of the Hall element 1, the switch circuit 2, the differential amplifier 3, the amplifier 4A, the capacitor C1A, the switch S1A, and the reference voltage circuit ref1A and the reference voltage circuit ref2A of the detection voltage setting circuit 5 is the same as that of the magnetic sensor device in the first embodiment, and the timing chart of the switch control signals is also the same. Thus, the operation is also the same as that of the magnetic sensor device in the first embodiment. Specifically, the output of the amplifier 4A in the phase φC is expressed as follows based on the Expression (49).

$$VOA\phi C = A1A \times \{\Delta VsigA + (A2A/A1A) \times \Delta VrefA\} + A1A \times (Voa3A\phi C - Voa3A\phi F) + A2A \times (Voa4A\phi C - Voa4A\phi F) \qquad (63)$$

ΔVsigA and ΔVrefA in Expression (63) are expressed as follows based on Expressions (50) and (31).

$$\Delta VsigA = G \times \{(Vh1 + Vh2) + (Voh1 - Voh2) - (Voa1\phi C - Voa1\phi F) - (Voa2\phi F - Voa2\phi C)\} \qquad (64)$$

$$\Delta VrefA = (Vref2A\phi C - Vref1A\phi C) - (Vref2A\phi F - Vref1A\phi F) \qquad (65)$$

In those expressions, similarly to the above description, symbol A is suffixed to each term for clear discrimination from the added components.

Similarly to the circuit configuration A, the circuit configuration B formed of the Hall element 1, the switch circuit 2, the differential amplifier 3, the amplifier 4B, the capacitor C1B, the switch S1B, and the reference voltage circuit ref1B and the reference voltage circuit ref2B of the detection voltage setting circuit 5 is the same as that of the magnetic sensor device in the first embodiment, and the operation is similar. However, the timing chart of the switch control signals is different in part. Specifically, the timing chart is different in that the detection state is the second detection state T2 in the phase φF and the first detection state T1 in the phase φC. Therefore, the voltages at the terminals V1 and V2 in the phase φF and the phase φC are expressed as follows, as opposed to Expressions (34) to (37) in the case of the circuit configuration A.

$$V1\phi C = Vcm1 + Vh1/2 + Voh1/2 \quad (66)$$

$$V2\phi C = Vcm1 - Vh1/2 - Voh1/2 \quad (67)$$

$$V1\phi F = Vcm2 - Vh2/2 + Voh2/2 \quad (68)$$

$$V2\phi F = Vcm2 + Vh2/2 - Voh2/2 \quad (69)$$

The operation of the circuit configuration B is the same as the operation of the circuit configuration A. Based on Expressions (66) to (69), the output of the amplifier 4B in the phase φC is derived as follows similarly to Expressions (38) to (50).

$$VOB\phi C = A1B \times \{\Delta VsigB + (A2B/A1B) \times \times VrefB\} + A1B \times (Voa3B\phi C - Voa3B\phi F) + A2B \times (Voa4B\phi C - Voa4B\phi F) \quad (70)$$

ΔVsigB and ΔVrefB in Expression (70) are expressed as follows.

$$\Delta VsigB = G \times \{-(Vh1 + Vh2) - (Voh1 - Voh2) - (Voa1\phi C - Voa1\phi F) - (Voa2\phi F - Voa2\phi C)\} \quad (71)$$

$$\Delta VrefB(Vref2B\phi C - Vref1B\phi C) - (Vref2B\phi F - Vref1B\phi F) \quad (72)$$

In those expressions, A1B and A2B are the gains of the differential amplifiers 41 and 42 of the amplifier 4B, and Voa3B and Voa4B are input offset voltages at the second input terminal V6B of the first differential pair of the amplifier 4B and the second input terminal V8B of the second differential pair of the amplifier 4B, respectively.

As expressed by the above expressions, also in the circuit configuration B, similarly to the magnetic sensor device in the first embodiment, the input offset voltages Voa1, Voa2, Voa3B, and Voa4B of the differential amplifier 3 and the amplifier 4B and the element offset voltage Voh of the Hall element 1 are removed in the comparison operation of the amplifier 4B in the phase φC, and hence highly-precise magnetic field intensity detection is realized.

Similarly to the circuit configuration A, the magnetic field intensity detection may be performed in two phases, the phase φF and the phase φC, and hence high-speed and highly-precise magnetic field intensity detection is realized. In addition, the circuit configuration A is in the phase φC in the second detection state T2, and the circuit configuration B is in the phase φC in the first detection state T1, and hence a highly-precise result of magnetic field intensity detection is obtained from the amplifier 4A in the second detection state T2, and a highly-precise result of magnetic field intensity detection is obtained from the amplifier 4B in the first detection state T1. Thus, the operation speed may be doubled as compared to the magnetic sensor device in the first embodiment.

Therefore, this configuration may increase the operation speed without adding a sensor element and a differential amplifier 3 which need a large area and high power consumption and without increasing power consumption caused by speeding-up of analog circuits of the differential amplifier 3 and the amplifier 4. Further, as illustrated in the switch control signals of the timing chart of FIG. 13, the control signal of the switch S1B is reverse in phase to the control signal of the switch S1A, and hence this circuit configuration has another great advantage that the circuit for producing the switch control signals may be realized without adding a complicated circuit.

Now, an exemplary circuit configuration of the detection voltage setting circuit 5, which is a component of the magnetic sensor device of FIG. 12, is described below.

Figure 14:
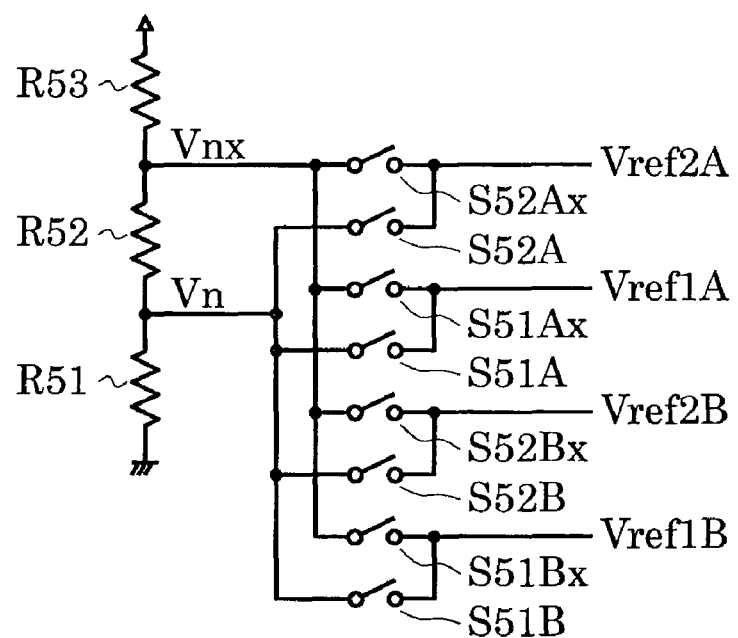
FIG. 14 is an exemplary circuit diagram of a detection voltage setting circuit used in the second embodiment of the present invention.

FIG. 14 is an example of the detection voltage setting circuit 5. The detection voltage setting circuit 5 of FIG. 14 is different from the detection voltage setting circuit 5 of FIG. 5 in that switches S51B, S51Bx, S52B, and S52Bx are added and symbol A is suffixed to the switches S51, S51x, S52, and S52x for clear discrimination from the added components. Symbol A is suffixed also to the positive terminals of the reference voltage circuit ref1 and the reference voltage circuit ref2. The added components are configured and connected as follows.

Each of the switches S51B, S51Bx, S52B, and S52Bx has two terminals, and is controlled to be turned ON or OFF in accordance with a switch control signal (not shown). One terminal of the switch S51B is connected to the connection point Vn, and the other terminal thereof is connected to the positive terminal of the reference voltage circuit ref1B. One terminal of the switch S51Bx is connected to the connection point Vnx, and the other terminal thereof is connected to the positive terminal of the reference voltage circuit ref1B. One terminal of the switch S52B is connected to the connection point Vn, and the other terminal thereof is connected to the positive terminal of the reference voltage circuit ref2B. One terminal of the switch S52Bx is connected to the connection point Vnx, and the other terminal thereof is connected to the positive terminal of the reference voltage circuit ref2B. In the following description, voltages at the power supply voltage terminal VDD and the ground terminal VSS are represented by "VDD" and "VSS", respectively, voltages at the connection points Vn and Vnx are represented by "Vn" and "Vnx", respectively, and voltages at the positive terminals of the reference voltage circuit ref1A, the reference voltage circuit ref2A, the reference voltage circuit ref1B, and the reference voltage circuit ref2B are represented by "reference voltage Vref1A", "reference voltage Vref2A", "reference voltage Vref1B", and "reference voltage Vref2B", respectively.

The detection voltage setting circuit 5 of FIG. 14 is connected as described above, and operates as follows. The voltages at the connection points Vn and Vnx are given by Expression (53) and Expression (54) similarly to the detection voltage setting circuit 5 illustrated in FIG. 5, and may be arbitrarily adjusted.

The switches S51A and S51Ax are controlled so that one switch is turned ON and the other is turned OFF. Therefore, any one of the voltages Vn and Vnx is output as the reference voltage Vref1A. Similarly, the switches S52A and S52Ax, the switches S51B and S51Bx, and the switches S52B and S52Bx are respectively controlled so that one switch is turned ON and the other is turned OFF. Therefore, any one of the voltages Vn and Vnx is output as the reference voltages Vref2A, Vref1B, and Vref2B.

Figure 15:
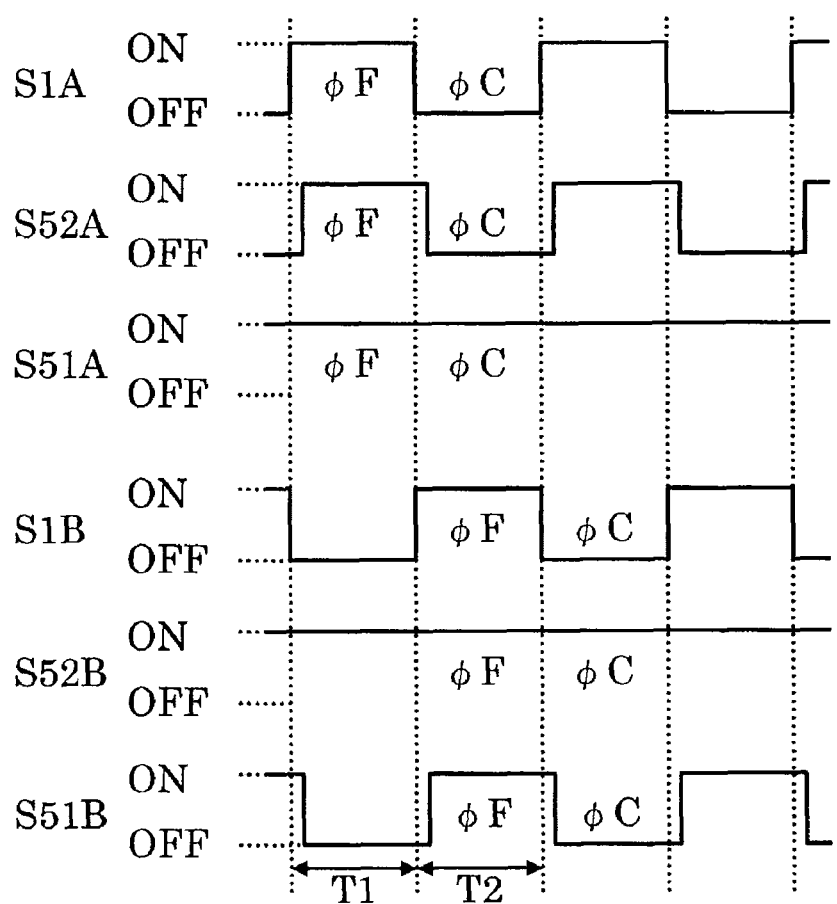
FIG. 15 is an exemplary timing chart of switch control signals according to the second embodiment of the present invention.

Now, it is assumed that the respective switches of the detection voltage setting circuit 5 illustrated in FIG. 14 are controlled by switch control signals of a timing chart illustrated in FIG. 15.

FIG. 15 illustrates an exemplary timing chart of the switch control signals. The timing chart of FIG. 15 is different from the timing chart of FIG. 6 in that the control signals of the switches S1B, S51B, and S52B are additionally illustrated, and symbol A is suffixed to the control signals of the switches S1, S51, and S52.

The switches S1A, S51A, S51Ax, S52A, and S52Ax are controlled similarly to the timing chart illustrated in FIG. 6, and the reference voltages Vref1A and Vref2A in the respective phases are determined as follows.

Vref1AφF=Vn
Vref1AφC=Vn
Vref2AφF=Vn
Vref2AφC=Vnx

Based on the above expressions and Expression (65), Expression (73) is obtained.

$$\Delta VrefA = (Vnx - Vn) \quad (73)$$

On the other hand, the switch S1B is controlled to be turned ON in the phase φF and OFF in the phase φC, the switch S52B is controlled to be turned ON both in the phase φF and in the phase φC, the switch S52Bx is controlled to be turned OFF both in the phase φF and in the phase φC, the switch S51B is controlled to be turned ON in the phase φF and OFF in the phase φC, and the switch S51Bx is controlled to be turned OFF in the phase φF and ON in the phase φC. For the same reason described for the timing chart of FIG. 6, FIG. 15 exaggerates so that the switch timings of the switches S51B and S51Bx are delayed from the switch timing of the switch S1B. When the switch S1B is turned ON, the timing of turning ON the switch S1B and the timing of switching the switches S51B and S51Bx may be the same. In contrast, the timing of switching the switches S51B and S51Bx may be earlier. This is similarly to the description of the timing chart of FIG. 6.

Through the above-mentioned control of the respective switches, the reference voltages Vref1B and Vref2B in the respective phases are determined as follows.

Vref1BφF=Vn
Vref1BφC=Vnx
Vref2BφF=Vn
Vref2BφC=Vn

Based on the above expressions and Expression (72), Expression (74) is obtained.

$$\Delta VrefB = -(Vnx - Vn) \quad (74)$$

The polarities of the voltage ΔVrefB are reverse to the voltage ΔVrefA expressed in Expression (73). Focusing on the term "element signal voltage Vh" of the Hall element 1 included in ΔVsigA expressed by Expression (64) and ΔVsigB expressed by Expression (71), the polarities are reverse, and accordingly both the circuit configuration A and the circuit configuration B detect the magnetic field of the same polarity. For example, when the circuit configuration A detects the S-pole, the circuit configuration B also detects the S-pole, and when the circuit configuration A detects the N-pole, the circuit configuration B also detects the N-pole. Specifically, the comparison result of the circuit configuration A is output in the second detection state T2 corresponding to the phase φC, and the comparison result of the circuit configuration B is output in the first detection state T1 corresponding to the phase φC. Thus, the operation speed may be doubled as compared to the magnetic sensor device in the first embodiment illustrated in FIG. 1. As described above, the advantage of the magnetic sensor device according to the second embodiment of the present invention is that the operation speed may be increased with minimal addition of circuits. Similarly, the detection voltage setting circuit 5 also has an advantage that the operation speed may be increased by adding the switches.

Figure 16:
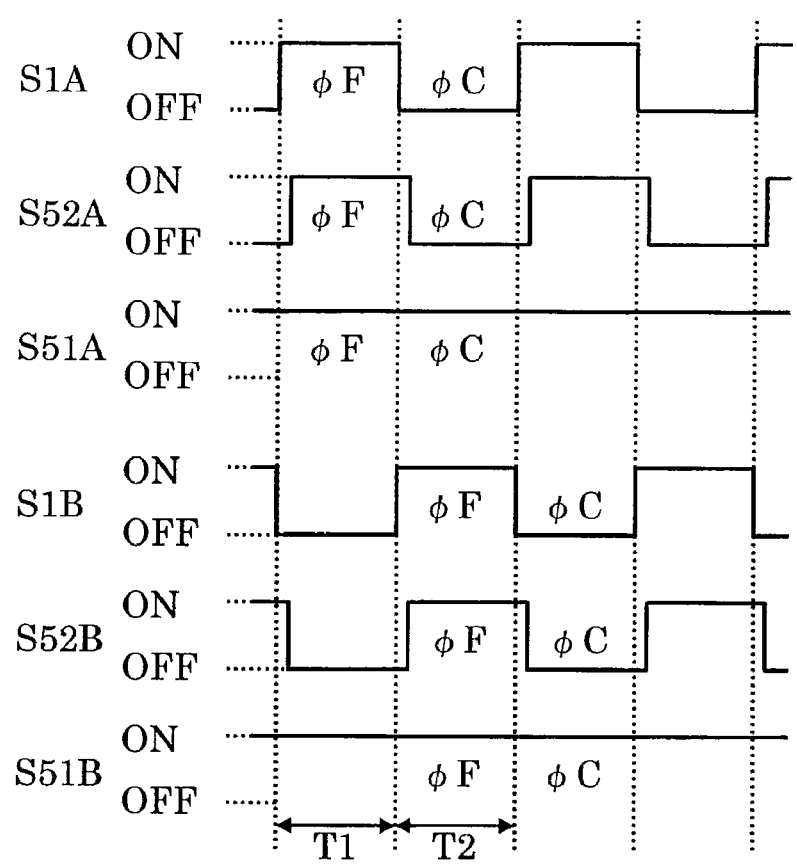
FIG. 16 is another exemplary timing chart of the switch control signals according to the second embodiment of the present invention.

Alternatively, it is assumed that the respective switches of the detection voltage setting circuit 5 illustrated in FIG. 14 are controlled by switch control signals of a timing chart illustrated in FIG. 16.

FIG. 16 illustrates an exemplary timing chart of the switch control signals. The timing chart of FIG. 16 is different from the timing chart of FIG. 15 in that the switch S52B is controlled to be turned ON in the phase φF and OFF in the phase φC, the switch S52Bx is controlled to be turned OFF in the phase φF and ON in the phase φC, the switch S51B is controlled to be turned ON both in the phase φF and in the phase φC, and the switch S51Bx is controlled to be turned OFF both in the phase φF and in the phase φC. The other switches are controlled similarly to the timing chart illustrated in FIG. 15.

Through the above-mentioned control of the respective switches, the reference voltages Vref1B and Vref2B in the respective phases are determined as follows.

Vref1BφF=Vn
Vref1BφC=Vn
Vref2BφF=Vn
Vref2BφC=Vnx

Based on the above expressions and Expression (72), Expression (75) is obtained.

$$\Delta VrefB = (VnX - Vn) \quad (75)$$

On the other hand, ΔVrefA is obtained as the same voltage as ΔVrefA expressed by Expression (73), and hence ΔVrefB and ΔVrefA are voltages with the same polarity. Similarly to the description of FIG. 15, focusing on the term "element signal voltage Vh" of the Hall element 1 included in ΔVsigA expressed by Expression (64) and ΔVsigB expressed by Expression (71), the polarities are reverse, and hence the circuit configuration A and the circuit configuration B detect the magnetic fields of different polarities in the case of the timing chart illustrated in FIG. 16. For example, when the circuit configuration A detects the S-pole, the circuit configuration B detects the N-pole, and when the circuit configuration A detects the N-pole, the circuit configuration B detects the S-pole. Thus, the operation speed may be doubled as compared to the case of detecting the magnetic fields of the S-pole and the N-pole by the magnetic sensor device in the first embodiment.

Figure 17:
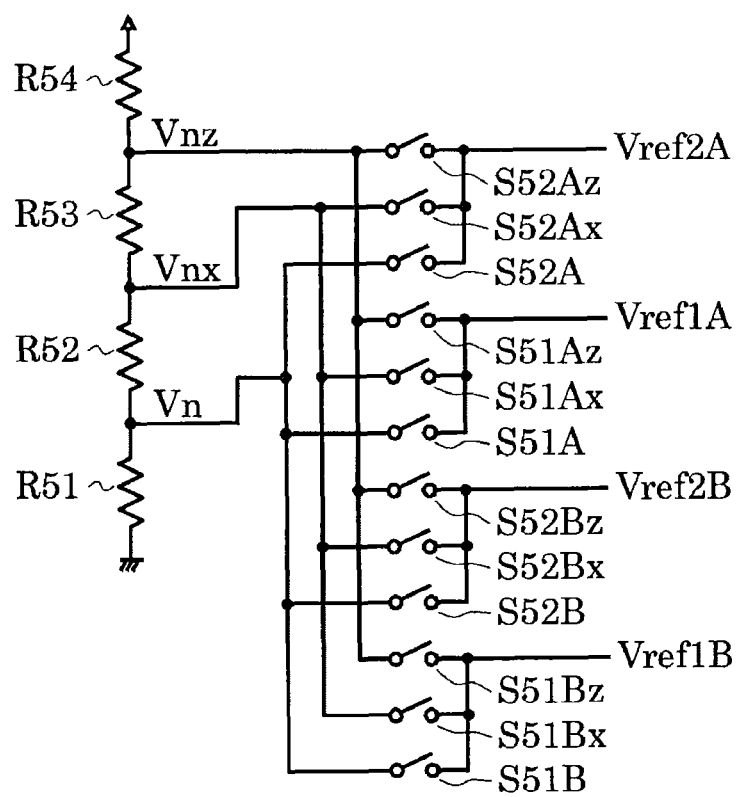
FIG. 17 is another exemplary circuit diagram of the detection voltage setting circuit used in the second embodiment of the present invention.
Figure 18:
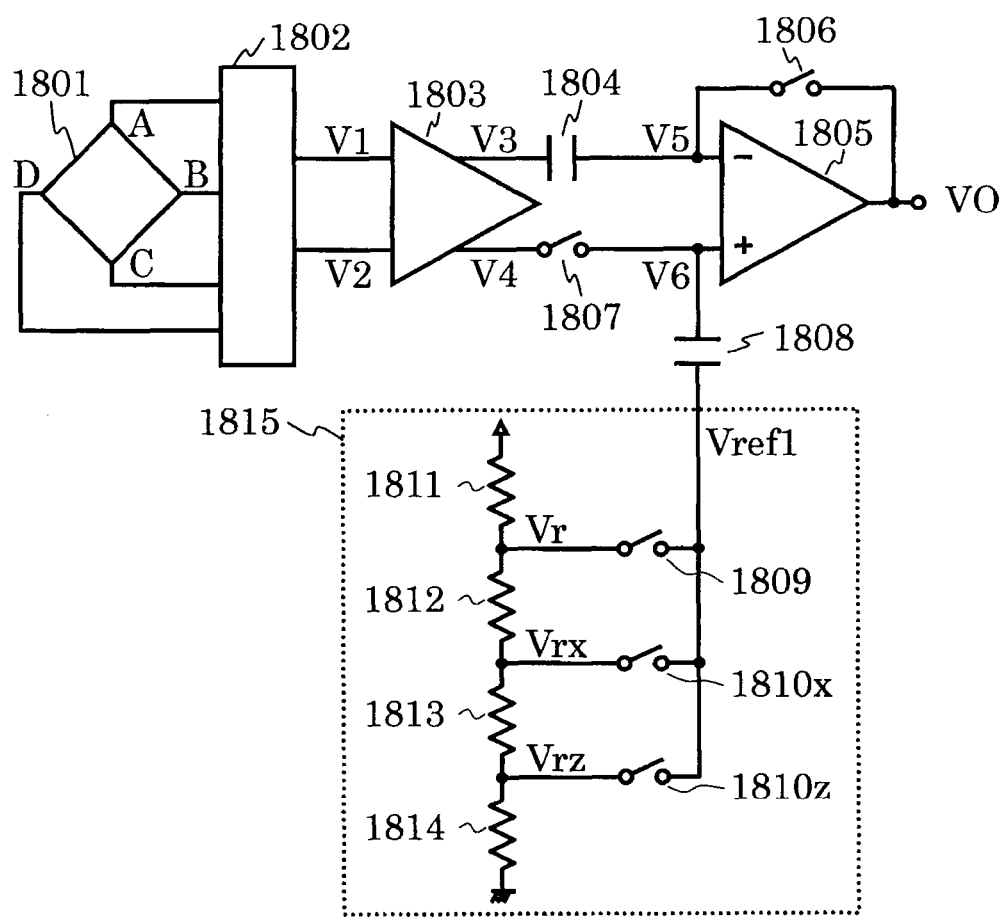
FIG. 18 is a circuit diagram of a conventional magnetic sensor device.
Figure 19:
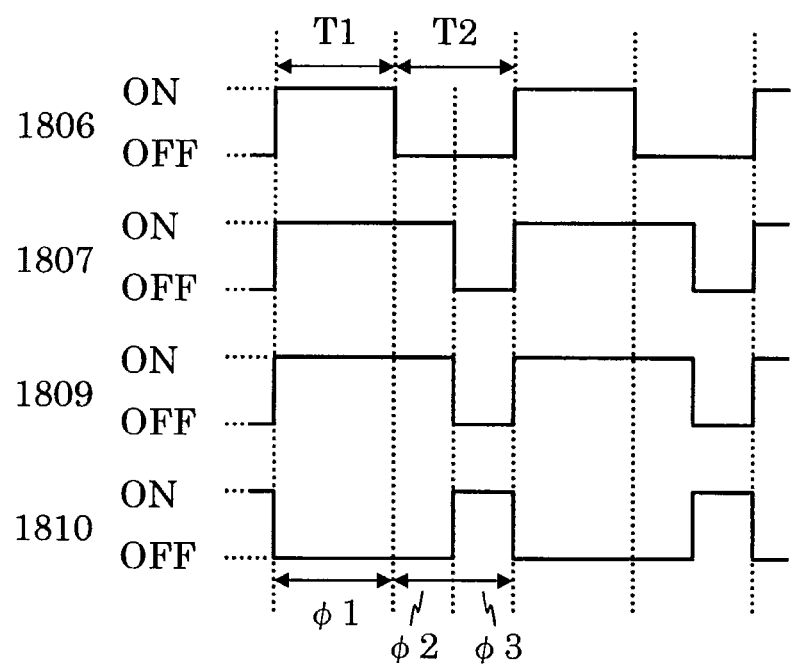
FIG. 19 is a timing chart of switch control signals of the conventional magnetic sensor device.

FIG. 17 illustrates another example of the detection voltage setting circuit 5.

FIG. 17 is an example of the detection voltage setting circuit 5. FIG. 17 is different from FIG. 14 in that a resistor R54 and switches S52Az, S51Az, S52Bz, and S51Bz are added. The added components are configured and connected as follows. The resistors R54, R53, R52, and R51 are connected similarly to FIG. 9. The voltages at the respective connection points Vn, Vnx, and Vnz are given by Expression (58), Expression (59), and Expression (60), and may be arbitrarily adjusted. Each of the switches S52Az, S51Az, S52Bz, and S51Bz has two terminals, and is controlled to be turned ON or OFF in accordance with a switch control signal (not shown). One terminal of the switch S52Az is connected to the connection point Vnz, and the other terminal thereof is connected to the positive terminal of the reference voltage circuit ref2A. One terminal of the switch S51Az is connected to the connection point Vnz, and the other terminal thereof is connected to the positive terminal of the reference voltage circuit ref1A. One terminal of the switch S52Bz is connected to the connection point Vnz, and the other terminal thereof is connected to the positive terminal of the reference voltage circuit ref2B. One terminal of the switch S51Bz is connected to the connection point Vnz, and the other terminal thereof is connected to the positive terminal of the reference voltage circuit ref1B. The other components than the added ones are connected similarly to FIG. 14.

The detection voltage setting circuit 5 of FIG. 17 is connected as described above, and operates as follows.

The switches S51A, S51Ax, and S51Az are controlled so that the switches S51Ax and S51Az are both turned OFF when the switch S51A is turned ON and that one of the switches S51Ax and S51Az is turned ON and the other is turned OFF when the switch S51A is turned OFF. Similarly, the switches S52A, S52Ax, and S52Az are controlled so that the switches S52Ax and S52Az are both turned OFF when the switch S52A is turned ON and that one of the switches S52Ax and S52Az is turned ON and the other is turned OFF when the switch S52A is turned OFF. Similarly, the switches S51B, S51Bx, and S51Bz are controlled so that the switches S51Bx and S51Bz are both turned OFF when the switch S51B is turned ON and that one of the switches S51Bx and S51Bz is turned ON and the other is turned OFF when the switch S51B is turned OFF. Similarly, the switches S52B, S52Bx, and S52Bz are controlled so that the switches S52Bx and S52Bz are both turned OFF when the switch S52B is turned ON and that one of the switches S52Bx and S52Bz is turned ON and the other is turned OFF when the switch S52B is turned OFF.

Similarly to FIG. 9, the switches S51Az, S52Az, S51Bz, and S52Bz are provided to provide hysteresis to the detection voltage. In the case where magnetic field intensity is detected by a detection voltage set by the switch S51Az or S52Az or the switch S51Bz or S52Bz, the switch to be turned ON in the next detection period T is changed from S51Az to S51Ax, from S52Az to S52Ax, from S51Bz to S51Bx, or from S52Bz to S52Bx. Similarly, in the case where magnetic field intensity detection is cancelled, the switch to be turned ON in the next detection period T is changed from S51Ax to S51Az, from S52Ax to S52Az, from S51Bx to S51Bz, or from S52Bx to S52Bz. In this way, also in the magnetic sensor device according to the second embodiment of the present invention, chattering generated at the time of magnetic field intensity detection and cancelling may be suppressed with minimal addition of circuit components.

The operation of the magnetic sensor device according to the second embodiment of the present invention has been described above to show that highly-precise and high-speed magnetic detection may be realized and that the operation speed may be doubled as compared to the magnetic sensor device according to the first embodiment of the present invention with minimal addition of circuits. In the description above, the specific circuit configuration and timing chart for the detection voltage setting circuit 5 have been exemplified. Similarly to the magnetic sensor device according to the first embodiment of the present invention, however, this embodiment is not necessarily limited to this configuration as long as the operation described above may be performed. For example, the first input terminal V5B of the first differential input pair of the amplifier 4B may be connected to the second output terminal V4 of the differential amplifier 3 via the capacitor C1B, and the second input terminal V6B of the first differential input pair may be connected to the first output terminal V3 of the differential amplifier 3. In this case, by appropriately setting the reference voltage circuit ref1B and the reference voltage circuit ref2B, the same effect as in the circuit of FIG. 12 may be obtained.

Third Embodiment

Figure 20:
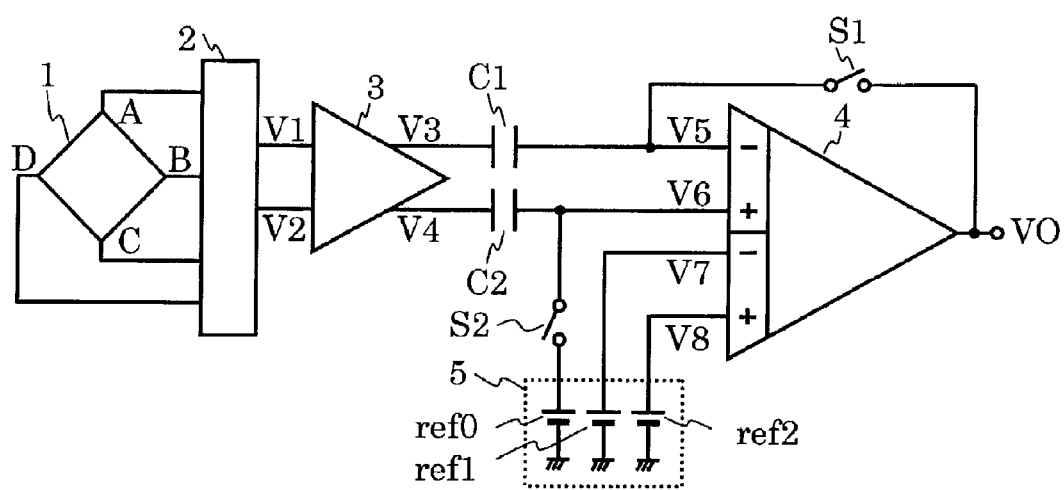
FIG. 20 is a circuit diagram of a magnetic sensor device according to a third embodiment of the present invention.

FIG. 20 is a circuit diagram of a magnetic sensor device according to a third embodiment of the present invention. The third embodiment of FIG. 20 is different from the first embodiment of FIG. 1 in that a capacitor C2 and a switch S2 are added, and that a reference voltage circuit ref0 is added in the detection voltage setting circuit 5. The added components are configured and connected as follows.

The capacitor C2 has two terminals. One terminal is connected to the second output terminal V4 of the differential amplifier 3. The other terminal is connected to the second input terminal V6 of the first differential input pair of the amplifier 4.

The switch S2 has two terminals. One terminal is connected to the second input terminal V6 of the first differential input pair of the amplifier 4. The other terminal is connected to a positive terminal of the reference voltage circuit ref0. The switch S2 is controlled to be turned ON or OFF in accordance with a switch control signal (not shown in the circuit diagram). The other connections and configurations are the same as in the first embodiment.

Next, the operation of the magnetic sensor device in the third embodiment is described below. Similarly to the switch S1, the switch S2 is controlled to be turned ON in the phase $\phi F$ and OFF in the phase $\phi C$. The other components operate similarly as described in the first embodiment.

Figure 21:
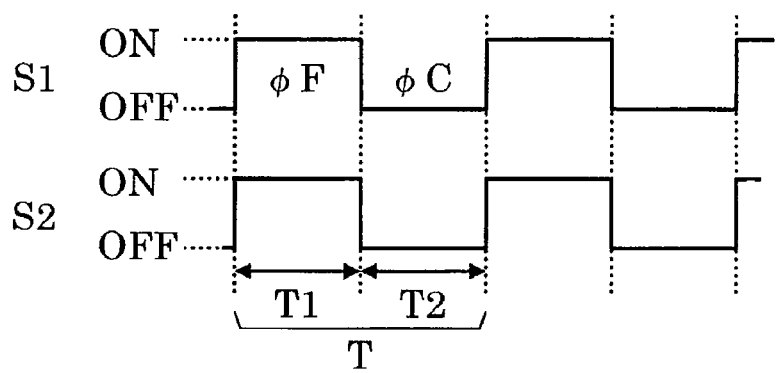
FIG. 21 is an exemplary timing chart of switch control signals according to the third embodiment of the present invention.

FIG. 21 illustrates a timing chart of the switch control signals in the magnetic sensor device according to the third embodiment. The timing chart of the switch control signals of FIG. 21 is different from the timing chart in the first embodiment illustrated in FIG. 4 in that the control signal of the added switch S2 is additionally illustrated. Similarly to the switch S1, the switch S2 is controlled to be turned ON in the phase $\phi F$ and OFF in the phase $\phi C$.

In this case, the circuit configuration formed of the Hall element 1, the switch circuit 2, the differential amplifier 3, the amplifier 4, the capacitor C1, the switch S1, and the reference voltage circuit ref1 and the reference voltage circuit ref2 of the detection voltage setting circuit 5 is the same as that of the magnetic sensor device in the first embodiment, and the timing chart of the switch control signals is also the same. Thus, the operation is also the same as that of the magnetic sensor device in the first embodiment. The operation of the magnetic sensor device in the third embodiment is different from the operation of the magnetic sensor device in the first embodiment in how to apply a voltage to the second input terminal V6 of the first differential input pair of the amplifier 4.

In the first embodiment, in the phase $\phi F$, the voltage of the second input terminal V6 of the first differential input pair of the amplifier 4 is applied from the second output terminal V4 of the differential amplifier 3. In this embodiment, however, the voltage of the second input terminal V6 is applied from the positive terminal of the reference voltage circuit ref0 via the turned-ON switch S2. When the voltage of the positive terminal of the reference voltage circuit ref0 is represented by Vref0, a voltage $\Delta VC1\phi F$ to be charged in the capacitor C1 in the phase $\phi F$ is determined as follows by replacing V6=V4 with V6=Vref0 in the derivation of Expressions (20) and (21).

$$\Delta VC1\phi F = (V3\phi F - Vref0\phi F) - (A2/A1) \times (Vref2\phi F - Vref1\phi F) \quad (76)$$

A difference $\Delta VC2\phi F$ between the voltage V4 and the voltage V6 is charged in the capacitor C2. In the phase $\phi F$, V6=Vref0 is established, and hence the following expression is obtained.

$$\Delta VC2\phi F = V4\phi F - V6\phi F = V4\phi F - Vref0\phi F \quad (77)$$

On the other hand, in the phase $\phi C$, the switch S2 is controlled to be turned OFF. The voltage $\Delta VC2\phi F$ is charged in the capacitor C2, and hence the voltage V6 is expressed by the following expression.

$$V6\phi C = V4\phi C - \Delta VC2\phi F \quad (78)$$

The output VO of the amplifier 4 is expressed similarly to Expression (25). In the derivation of Expressions (25) and (26), V6 is given by Expression (78), rather than V6=V4, and the following expression is obtained.

$$VO\phi C = A1 \times \{(V4\phi C - \Delta VC2\phi F - V5\phi C) + (A2/A1) \times (Vref2\phi C - Vref1\phi C)\} \quad (79)$$

The voltage V5 is expressed similarly to Expression (24), and hence Expression (24) is substituted into the above expression to be rearranged as follows.

$$VO\phi C = A1 \times \{(V4\phi C - V3\phi C) + (A2/A1) \times (Vref2\phi C - Vref1\phi C)\} + A1 \times (\Delta VC1\phi - \Delta VC2\phi F) \quad (80)$$

When comparing the above expression and Expression (27) described in the first embodiment, the term "−A1× ΔVC2ϕF" is added in the above expression. Then, the voltage ΔVC1ϕF charged in the capacitor C1, which is expressed by Expression (76), and the voltage ΔVC2ϕF charged in the capacitor C2, which is expressed by Expression (77), are substituted into Expression (80) to be rearranged to obtain the following expression.

$$VO\phi C = A1 \times [-\{(V3\phi C - V4\phi C) - (V3\phi F - V4\phi F)\} + (A2/A1) \times \{(Vref2\phi C - Vref1\phi C) - (Vref2\phi F - Vref1\phi F)\}] \quad (81)$$

Expression (81) does not include the term "Vref0". This is because the term "Vref0ϕF" is included both in the voltage ΔVC1ϕF charged in the capacitor C1 and in the voltage ΔVC2ϕF charged in the capacitor C2 and hence the term "Vref0" is cancelled out in calculating the difference between ΔVC1ϕF and ΔVC2ϕF. Expression (81) is exactly the same as Expression (28) described in the first embodiment. This means that the magnetic sensor device in this embodiment has the function of highly-precise and high-speed magnetic detection comparable to the magnetic sensor device in the first embodiment, irrespective of the value of the voltage Vref0. In an actual circuit, if the voltage at the second output terminal V4 of the differential amplifier 3 deviates from the common-mode input voltage range of the amplifier 4 due to the characteristics and the offset voltage of the Hall element 1, the offset voltage of the differential amplifier 3, or the like, highly-precise and high-speed magnetic detection may not be performed normally. According to the magnetic sensor device in this embodiment, the voltage Vref0 at the positive terminal of the reference voltage circuit ref0 is selected so as to fall within the common-mode input voltage range of the amplifier 4, and hence there is an advantage that highly-precise and high-speed magnetic detection may be performed without impairing the advantage of the magnetic sensor device in the first embodiment. In other words, there is an advantage that the requirement of a wide common-mode input voltage range of the amplifier 4 is greatly relaxed.

Figure 22:
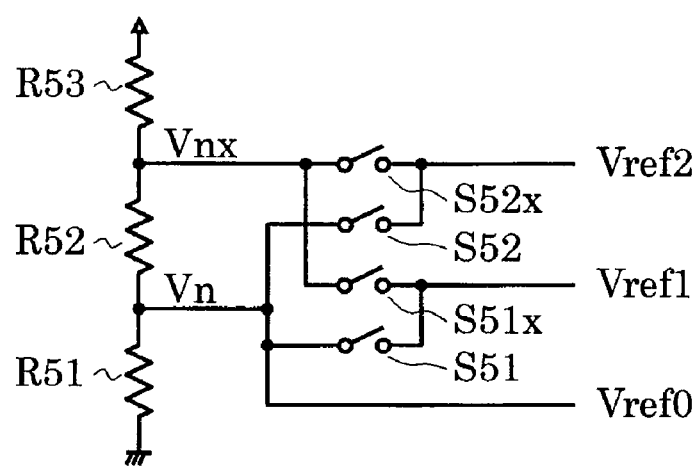
FIG. 22 is an exemplary circuit diagram of a detection voltage setting circuit used in the third embodiment of the present invention.

FIG. 22 is an example of the detection voltage setting circuit 5 in the third embodiment. FIG. 22 is different from FIG. 5 in that the positive terminal of the reference voltage circuit ref0 is added. The other configurations are the same as in FIG. 5. The positive terminal of the reference voltage circuit ref0 is connected to the connection point Vn, and this voltage is referred to as "reference voltage Vref0". The other connections are the same as in FIG. 5. The detection voltage setting circuit 5 operates similarly to the detection voltage setting circuit 5 of FIG. 5.

In this circuit, the positive terminal of the reference voltage circuit ref0 is connected to the connection point Vn, but it is preferred to select the reference voltage Vref0 so as to fall within the common-mode input voltage range of the amplifier 4 as described above, and hence the positive terminal of the reference voltage circuit ref0 may be connected to any connection point as long as the reference voltage Vref0 does not deviate from this range. For example, the positive terminal of the reference voltage circuit ref0 may be connected to the connection point Vnx, the positive terminal of the reference voltage circuit ref1, or the positive terminal of the reference voltage circuit ref2.

The operation of the magnetic sensor device according to the third embodiment of the present invention has been described above to show that highly-precise and high-speed magnetic detection may be realized similarly to the magnetic sensor device in the first embodiment.

Figure 23:
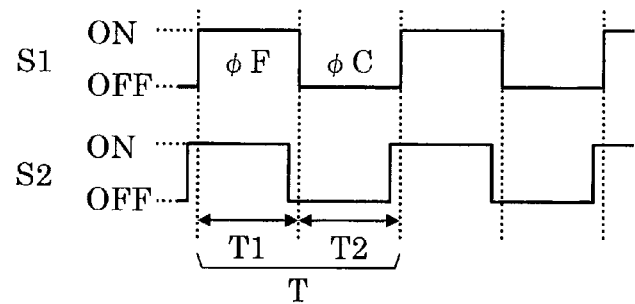
FIG. 23 is another exemplary timing chart of the switch control signals according to the third embodiment of the present invention.

In the description above, the specific circuit configuration and switch control timing chart for the differential amplifier 3, the amplifier 4, and the detection voltage setting circuit 5 have been exemplified. Similarly to the magnetic sensor device according to the first embodiment of the present invention, however, this embodiment is not necessarily limited to the configuration and switch control timings described above as long as the operation described above may be performed. For example, in the switch control timing chart of FIG. 21, the control signals of the switch S1 and the switch S2 are separately illustrated. However, the switch S1 and the switch S2 are controlled at the same timing as illustrated in FIG. 21, and hence may be controlled by the same control signal. Alternatively, as illustrated in FIG. 23, the timing of turning OFF the switch S2 may be prior to the timing of turning OFF the switch S1. In the case where the transient response characteristics of the amplifier 4 are good or in the case where a parasitic capacitance between the first input terminal V5 of the first differential input pair of the amplifier 4 and the second input terminal V6 of the first differential input pair thereof is too large to be neglected, switching noise generated at the time of turning OFF the switch S2 may propagate from the second input terminal V6 of the first differential input pair to the first input terminal V5 of the first differential input pair, to thereby cause a non-negligible error in the voltage to be charged in the capacitor C1. In this case, as illustrated in the timing chart of FIG. 23, it is more appropriate to delay the timing of turning OFF the switch S1 with respect to the timing of turning OFF the switch S2.

Fourth Embodiment

Figure 24:
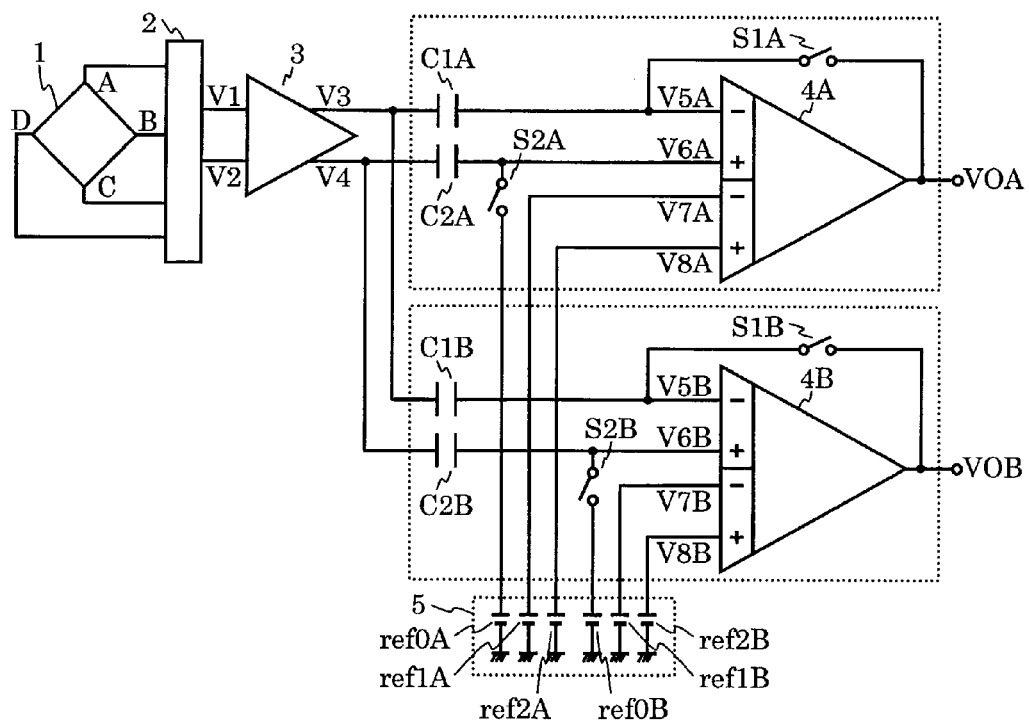
FIG. 24 is a circuit diagram of a magnetic sensor device according to a fourth embodiment of the present invention.

FIG. 24 is a circuit diagram of a magnetic sensor device according to a fourth embodiment of the present invention. The fourth embodiment of FIG. 24 is different from the second embodiment of FIG. 12 in that a capacitor C2A, a capacitor C2B, a switch S2A, and a switch S2B are added, and that a reference voltage circuit ref0A and a reference voltage circuit ref0B are added in the detection voltage setting circuit 5. The added components are configured and connected as follows.

The capacitor C2A has two terminals. One terminal is connected to the second output terminal V4 of the differential amplifier 3. The other terminal is connected to the second input terminal V6A of the first differential input pair of the amplifier 4A. The switch S2A has two terminals. One terminal is connected to the second input terminal V6A of the first differential input pair of the amplifier 4A. The other terminal is connected to a positive terminal of the reference voltage circuit ref0A. The switch S2A is controlled to be turned ON or OFF in accordance with a switch control signal (not shown in the circuit diagram). The capacitor C2B has two terminals. One terminal is connected to the second output terminal V4 of the differential amplifier 3. The other terminal is connected to the second input terminal V6B of the first differential input pair of the amplifier 4B. The switch S2B has two terminals. One terminal is connected to the second input terminal V6B of the first differential input pair of the amplifier 4B. The other terminal is connected to a positive terminal of the reference voltage circuit ref0B. The switch S2B is controlled to be turned ON or OFF in accordance with a switch control signal (not shown in the circuit diagram). The other connections and configurations are the same as in the second embodiment.

Next, the operation of the magnetic sensor device in the fourth embodiment is described below. Similarly to the switch S1A, the switch S2A is controlled to be turned ON in the phase φF and OFF in the phase φC. Similarly to the switch S1B, the switch S2B is controlled to be turned ON in the phase φF and OFF in the phase φC. The other components operate similarly as described in the second embodiment. Although the detailed description is omitted, the magnetic sensor device in this embodiment performs a combination of the operation of the magnetic sensor device in the second embodiment and the operation of the magnetic sensor device in the third embodiment without impairing the advantages thereof.

To be brief, the circuit configuration A formed of the Hall element 1, the switch circuit 2, the differential amplifier 3, the amplifier 4A, the capacitor C1A, the capacitor C2A, the switch S1A, the switch S2A, and the reference voltage circuit ref0A, the reference voltage circuit ref1A, and the reference voltage circuit ref2A of the detection voltage setting circuit 5 is the same as that of the magnetic sensor device in the third embodiment. By controlling the switch control signals similarly to the timing chart described for the magnetic sensor device in the third embodiment, the circuit configuration A operates similarly to the magnetic sensor device in the third embodiment.

Similarly to the circuit configuration A, the circuit configuration B formed of the Hall element 1, the switch circuit 2, the differential amplifier 3, the amplifier 4B, the capacitor C1B, the capacitor C2B, the switch S1B, the switch S2B, and the reference voltage circuits ref0B, the reference voltage circuit ref1B, and the reference voltage circuit ref2B of the detection voltage setting circuit 5 is the same as that of the magnetic sensor device in the third embodiment, and the operation is similar. By controlling the switch control signals similarly to the timing chart described for the magnetic sensor device in the second embodiment, the circuit configuration B performs a combination of the operation of the circuit configuration B described for the magnetic sensor device in the second embodiment and the operation of the magnetic sensor device in the third embodiment.

The operation of the magnetic sensor device according to the fourth embodiment of the present invention has been described above to show that highly-precise and high-speed magnetic detection may be realized and that the speed-up of the operation comparable to the magnetic sensor device according to the second embodiment of the present invention may be achieved with minimal addition of circuits.

While the magnetic sensor device of the present invention has been described above by way of specific examples, the present invention is not necessarily limited to the configuration and switch control timings described herein.

For example, the differential amplifier is connected between the sensor element and the amplifier in the above description, but the differential amplifier may be omitted in the case where the voltage of the signal of the sensor element is high, for example.

For example, in the amplifier 4, the second input terminal V6 of the first differential input pair is connected to the second output terminal V4 of the differential amplifier 3, and the second input terminal V8 of the second differential input pair is connected to the positive terminal of the reference voltage circuit ref2, but the same operation and effect may be obtained even when the connections are reversed.

The embodiments disclosed herein show that the detection may be performed by switch control of the detection voltage setting circuit 5 in the state where the S-pole and the N-pole are discriminated. However, even when the switch circuit 2 is configured to control switching between the S-pole and the N-pole, highly-precise and high-speed magnetic detection may be performed without impairing the advantages of the present invention.

The magnetic sensor device according to the present invention is also applicable to bipolar detection with the same effect.

The sensor element described herein is a magnetoelectric conversion element, but a sensor element for outputting a voltage in accordance with acceleration or pressure may be used instead.

What is claimed is:

1. A sensor device for generating a logic output in accordance with intensity of a physical quantity applied to a sensor element, the sensor device comprising:
   a switch circuit to be connected to a first terminal pair and a second terminal pair of the sensor element, for controlling switching between a terminal pair supplied with power and a terminal pair for outputting a signal voltage corresponding to the intensity of the physical quantity, and outputting a first signal voltage and a second signal voltage input from the terminal pair of the sensor element;
   a detection voltage setting circuit for outputting a first reference voltage and a second reference voltage; and
   a first amplifier including a first input terminal pair, a second input terminal pair, and an output terminal,
      the first input terminal pair including a first input terminal which is connected to the output terminal via a first switch and inputs a voltage based on the first signal voltage via a first capacitor,
      the first input terminal pair including a second input terminal which inputs one of a voltage based on the second signal voltage and the second reference voltage,
      the second input terminal pair including a first input terminal which inputs the first reference voltage,
      the second input terminal pair including a second input terminal which inputs one of the second reference voltage and the voltage based on the second signal voltage,
   wherein the switch circuit has a function of switching between:
      a first detection state in which power is supplied to the first terminal pair of the sensor element and the signal voltage is output from the second terminal pair; and
      a second detection state in which power is supplied to the second terminal pair of the sensor element and the signal voltage is output from the first terminal pair, and
   wherein the first amplifier is configured to generate the logic output based on the first detection state and the second detection state.

2. A sensor device according to claim 1,
   wherein the detection voltage setting circuit is configured to further output a third reference voltage and a fourth reference voltage,
   wherein the sensor device further comprises a second amplifier including a first input terminal pair, a second input terminal pair, and an output terminal,
      the first input terminal pair including a first input terminal which is connected to the output terminal via a second switch and inputs the voltage based on the first signal voltage via a second capacitor, the first input terminal pair including a second input terminal that inputs one of the voltage based on the second signal voltage and the fourth reference voltage, the second input terminal pair including a first input terminal that inputs the third reference voltage, the second input terminal pair including a second input terminal that inputs one of the fourth reference voltage and the voltage based on the second signal voltage, and wherein the first switch and the second switch are configured to be turned ON and OFF exclusively.

3. A sensor device according to claim 1, wherein the second input terminal of the first input terminal pair of the first amplifier is configured to input the voltage based on the second signal voltage via a second capacitor, and is connected to an arbitrary voltage supply source via a second switch.

4. A sensor device according to claim 2,
wherein the second input terminal of the first input terminal pair of the first amplifier is configured to input the voltage based on the second signal voltage via a third capacitor, and is connected to an arbitrary voltage supply source via a third switch, and wherein the second input terminal of the first input terminal pair of the second amplifier is configured to input the voltage based on the second signal voltage via a fourth capacitor, and is connected to an arbitrary voltage supply source via a fourth switch.

5. A sensor device according to claim 1, wherein the detection voltage setting circuit comprises a plurality of resistors connected in series between a power supply terminal and a ground terminal, and the reference voltages are output from respective voltage-dividing points.

6. A sensor device according to claim 1, further comprising a differential amplifier including two input terminals connected to two output terminals of the switch circuit, respectively, and including two output terminals for outputting results obtained by amplifying the signal voltages.

7. A sensor device according to claim 1, wherein the physical quantity comprises magnetism.

8. A sensor device according to claim 1, wherein the physical quantity comprises pressure.

* * * * *